(12) United States Patent
Logue et al.

(10) Patent No.: US 9,478,361 B2
(45) Date of Patent: Oct. 25, 2016

(54) SELF-ASSEMBLED ORGANIC MONOLAYER HYBRID MATERIALS AND METHODS THEREOF

(71) Applicant: South Dakota Board of Regents, Brookings, SD (US)

(72) Inventors: Brian A. Logue, Aurora, SD (US); Mahdi Farrakh Baroughi, Brookings, SD (US); Venkataiah Mallam, Andhrapradesh (IN)

(73) Assignee: South Dakota Board of Regents, Brookings, SD (US)

( * ) Notice: Subject to any disclaimer, the term of this patent is extended or adjusted under 35 U.S.C. 154(b) by 285 days.

(21) Appl. No.: 14/477,344

(22) Filed: Sep. 4, 2014

(65) Prior Publication Data

US 2015/0064838 A1    Mar. 5, 2015

Related U.S. Application Data

(60) Provisional application No. 61/873,458, filed on Sep. 4, 2013, provisional application No. 61/891,451, filed on Oct. 16, 2013.

(51) Int. Cl.
| | | |
|---|---|---|
| *H01G 9/20* | (2006.01) | |
| *B05D 1/00* | (2006.01) | |
| *C23C 16/448* | (2006.01) | |
| *C23C 14/12* | (2006.01) | |
| *B05D 1/18* | (2006.01) | |

(52) U.S. Cl.
CPC .............. *H01G 9/2059* (2013.01); *B05D 1/60* (2013.01); *C23C 14/12* (2013.01); *C23C 16/4485* (2013.01); *H01G 9/2031* (2013.01); *B05D 1/185* (2013.01); *Y02E 10/542* (2013.01)

(58) Field of Classification Search
None
See application file for complete search history.

(56) References Cited

U.S. PATENT DOCUMENTS

| 6,403,382 B1* | 6/2002 | Zhu ........................ B05D 1/185 427/414 |
|---|---|---|
| 2004/0001943 A1* | 1/2004 | Alford ................. B01J 29/0308 428/312.6 |

OTHER PUBLICATIONS

Grätzel, "Dye-sensitized solar cells", Journal of Photochemistry and Photobiology C: Photochemistry Reviews, 2003, 4(2):145-153.
Hagfeldt et al., "Dye-Sensitized Solar Cells", Chemical Reviews, 2010, 110(11):6595-6663.
Hardin et al., "The renaissance of dye-sensitized solar cells", Nature Photonics, 2012, 6(3):162-169.
Chung et al., "All-solid-state dye-sensitized solar cells with high efficiency", Nature, 2012, 485(7399):486-489.
O'Reagan et al., "A low-cost, high-efficiency solar cell based on dye-sensitized colloidal $TiO_2$ films", Nature, 1991, vol. 353, pp. 737-740.

(Continued)

*Primary Examiner* — Nathan T Leong
(74) *Attorney, Agent, or Firm* — Patterson Thuente Pedersen, P.A.

(57) ABSTRACT

Self-assembled monolayer hybrid materials having a modified carboxylic acid deposited from the gas-phase onto a metal oxide substrate, methods of using targeted α-carbon modified carboxylic acids to rapidly deposit activated organic molecules into a self-assembled monolayer on metal oxide substrates, and the self-assembled monolayer hybrid materials capable of being used in various industries, such as optoelectronics and separation science.

19 Claims, 15 Drawing Sheets

(56) References Cited

OTHER PUBLICATIONS

Nazeeruddin et al., "Conversion of Light to Electricity by cis-$X_2Bis(2,2'$-bipyridyl-4,4'-dicarboxylate)ruthenium(II) Charge-Transfer Sensitizers (X-Cl$^-$, Br$^-$, I$^-$, CN$^-$, and SCN$^-$) on Nanocrystalline $TiO_2$ Electrodes", J. American Chemical Society, 1993, 115(14):6382-6390.

Nazeeruddin et al, "Acid-Base Equilibria of (2, 2'-Bipyridyl-4,4'-dicarboxylate acid)ruthenium(II) Complexes and the Effect of Protonation on Charge-Transfer Sensitization of Nanocrystalline Titania", Inorganic Chemistry, 1999, 38(26):6298-6305.

Yella et al., Porphyrin-Sensitized Solar Cells with Cobalt (II/III)-Based Redox Electrolyte Exceed 12 Percent Efficiency, Science, 2011, 334(6065):629-634.

Hamann et al., "Advancing beyond current generation dye-sensitized solar cells", Environmental Science, 2008, 1(1):66-78.

Pagliaro et al., "Nanochemistry aspects of titania in dye-sensitized solar cells", Energy & Environmental Science, 2009, 2(8):838-844.

Jose et al., "Metal Oxides for Dye-Sensitized Solar Cells", Journal of the American Ceramic Society, 2009, 92(2):289-301.

Zhang et al., "ZnO Nanostructures for Dye-Sensitized Solar Cells", Advanced Materials, 2009, 21(41):4087-4108.

Mor et al, "Use of Highly-Ordered $TiO_2$ Nanotube Arrays in Dye-Sensitized Solar Cells", Nano Letters, 2006, 6(2):215-218.

Hara et al., "Influence of electrolyte on the photovoltaic performance of a dye-sensitized $TiO_2$ solar cell based on a Ru(II) terpyridyl complex photosensitizer", Solar Energy Materials and Solar Cells, 2005, 85(1):21-30.

Wu et al., "An All-Solid-State Dye-Sensitized Solar Cell-Based Poly(N-alkyl-4-vinyl-pyridine iodide) Electrolyte with Efficiency of 5.64%", Journal of the American Chemical Society, 2008, 130(35):11568-11569.

Wang et al., "Ambient Temperature Plastic Crystal Electrolyte for Efficient, All-Solid-State Dye-Sensitized Solar Cell", Journal of the American Chemical Society, 2004, 126(42):13590-13591.

Bai et al., "High-performance dye-sensitized solar cells based on solvent-free electrolytes produced from eutectic melts", Nature Materials, 7(8):626-630.

Nusbaumer et al., "$Co^{II}(dbbip)_2^{2+}$ Complex Rivals Tri-iodide/Iodide Redox Mediator in Dye-Sensitized Photovoltaic Cells", The Journal of Physical Chemistry B, 2001, 105(43):10461-10464.

Snaith et al., "Efficiency Enhancements in Solid-State Hybrid Solar Cells via Reduced Charge Recombination and Increased Light Capture", Nano Letters, 2007, 7(11):3372-3376.

Meng et al., "Fabrication of an Efficient Solid-State Dye-Sensitized Solar Cell", Langmuir, 2003, 19(9):3572-3574.

Bach et al., "Solid-state dye-sensitized mesoporous $TiO_2$ solar cells with high photon-to-electron conversion efficiencies", Nature, 1993, 395(6702):583-585.

Kovash Jr. et al., "$TiO_2$ compact layers prepared by low temperature colloidal synthesis and deposition for high performance dye-sensitized solar cells", Electrochimica Acta, 2012, 67:18-23.

Ito et al., "Fabrication of thin film dye sensitized solar cells with solar to electric power conversion efficiency over 10%", Solid Films, 2008, 516(14):4613-4619.

Law et al., "Nanowire dye-sensitized solar cells", Nature materials, 2005, 4(6):455-459.

Zhu et al, "Enhanced Charge-Collection Efficiencies and Light Scattering in Dye-Sensitized Solar Cells Using Oriented $TiO_2$ Nanotubes Arrays", Nano Letters, 2007, 7(1):69-74.

Kim et al., "General Strategy for Fabricating Transparent $TiO_2$ Nanotube Arrays for Dye-Sensitized Photoelectrodes: Illumination Geometry and Transport Properties", ACSNano, 2011, 5(4):2647-2656.

Shrestha et al., "Dual Functionality of BODIPY Chromophore in Porphyrin-Sensitized Nanocrystalline Solar Cells", The Journal of Physical Chemistry C, 2012, 116(19):10451-10460.

Hara et al, "Oligothiophene-Containing Coumarin Dyes for Efficient Dye-Sensitized Solar Cells", The Journal of Physical Chemistry B, 2005, 109(32):15476-15482.

Ito et al., "High-Efficiency Organic-Dye-Sensitized Solar Cells Controlled by Nanocrystalline-$TiO_2$ Electrode Thickness", Advanced Materials, 2006, 18(9):1202-1205.

Bessho et al., "Highly Efficient Mesoscopic Dye-Sensitized Solar Cells Based on Donor-Acceptor-Substituted Porphyrins", Angewandte Chem International Edition, 2010, 49(37):6646-6649.

Hsieh et al., "Synthesis and characterization of porphyrin sensitizers with various electron-donating substituents for highly efficient dye-sensitized solar cells", Journal of Materials Chemistry, 2010, 20(6):1127-1134.

Zhu et al., "Organic D-A-$\pi$—A Solar Cell Sensitizers with Improved Stability and Spectral Response", Advanced Functional Materials, 2011, 21(4):756-763.

Ko et al., "Silole-spaced triarylamine derivatives as highly efficient organic sensitizers in dye-sensitized solar cells ($DSSC_S$)", Journal of Materials Chemistry, 2010, 20(12):2391-2399.

Choi et al., "Highly Efficient and Thermally Stable Organic Sensitizers for Solvent-Free Dye-Sensitized Solar Cells", Angewandte Chem, 2008, 120(2):333-336.

Li et al., "Determining the Conductivities of the Two Charge Transport Phases in Solid-State Dye-Sensitized Solar Cells by Impedance Spectroscopy", The Journal of Physical Chemistry C, 2013, 117:10980-10989.

Chandiran et al., "Low-Temperature Crystalline Titanium Dioxide by Atomic Layer Deposition for Dye-Sensitized Solar Cells", ACS Applied Materials & Interfaces, 2013, 5(8):3487-3493.

Kitamura et al., "Phenyl-Conjugated Oligoene Sensitizers for $TiO_2$ Solar Cells", Chemistry of Materials, 2004, 16(9):1806-1812.

Sommeling et al, "Influence of a $TiCl_4$ Post-Treatment on Nanocrystalline $TiO_2$ Films in Dye-Sensitized Solar Cells", J. of Physical Chemistry B, 2006, 110(39):19191-19197.

Thavasi et al., "Controlled electron injection and transport at materials interfaces in dye sensitized solar cells", Materials Science and Engineering R: Reports, 2009, 63(3):81-99.

Horiuchi et al., "High Efficiency of Dye-Sensitized Solar Cells Based on Metal-Free Indoline Dyes", Journal of the American Chemical Society, 2004, 126(39):12218-12219.

Liu et al., "Simple organic molecules bearing a 3,4-ethylenedioxythiophene linker for efficient dye-sensitized solar cells", Chemical Communications, 2008, 41:5152-5154.

Horiuchi et al., "Highly-efficient metal-free organic dyes for dye-sensitized solar cells", Chemical Communications, 2003, 24:3036-3037.

Campbell et al., "Porphyrins as light harvesters in the dye-sensitised $TiO_2$ solar cell", Coordination Chemistry Reviews, 2004, 248(13):1363-1379.

Nonnenmacher et al, "Kelvin probe force microscopy", Applied Physics Letters, 1991, 58:2921-2923.

Deacon et al., "Relationships Between the Carbon—Oxygen Stretching Frequencies of Carboxylato Complexes and the Type of Carboxylate Coordination", Coordination Chemistry Reviews, 1980, 33(3):227-250.

Shrotriya et al., "Accurate Measurement and Characterization of Organic Solar Cells", Advanced Functional Materials, 2006, 16(15):2016-2023.

Mann et al., "Optimizing the Photocurrent Efficiency of Dye-Sensitized Solar Cells through the Controlled Aggregation of Chalcogenoxanthylium Dyes on Nanocrystalline Titania Films", The Journal of Physical Chemistry C, 2008, 112(34):13057-13061.

* cited by examiner

SELF-ASSEMBLED ORGANIC MONOLAYER HYBRID MATERIALS AND METHODS THEREOF

RELATED APPLICATIONS

This application claims priority from U.S. Provisional Patent Application No. 61/873,458, filed Sep. 4, 2013, and U.S. Provisional Patent Application No. 61/891,451, filed Oct. 16, 2013, the disclosures of which are hereby incorporated by referenced herein in their entirety.

GRANT SUPPORT

This work was supported in part by NSF Grant #1102356 and NSF EPSCoR RII Grant #0903804. The Government may have certain rights in the invention as specified by law.

FIELD OF THE INVENTION

The present invention relates generally to the field of self-assembled monolayer hybrid materials, in particular modified carboxylic acids deposited from the gas phase onto a substrate, such as nanoporous metal oxides, methods of using targeted α-carbon modified carboxylic acids to rapidly deposit activated organic molecules into a self-assembled monolayer on oxide materials, and the self-assembled monolayer hybrid materials capable of being used in various industries, such as optoelectronics and separation science.

BACKGROUND OF THE INVENTION

Surface properties are of critical importance to a broad range of materials and devices. A number of surface functionalization techniques—thiol-gold self-assembled monolayers, chloro- or methoxy-silane surface attachment, carboxylic acid esterification, and phosphonic acid deposition—have produced materials leading to entire fields of research, and have significantly advanced others. However, the ability to rapidly and reproducibly create organic monolayers using gas-phase deposition to produce strong uni- and/or bi-dentate surface bonding on highly porous oxide materials that, when desired, are also able to efficiently transfer electrons to and from the substrate has yet to be realized.

A self-assembled monolayer consists of a single layer of molecules on a substrate. The formation of self-assembled monolayers has historically been accomplished through gold-alkylthiolate self-assembling monolayers; chlorosilane or alkoxysilane surface attachment; carboxylic acid esterification; and phosphonic acid deposition.

These methods form the self-assembled monolayer through the formation of chemical linkages between the reactant and the substrate. Gold-alkylthiolate self-assembling monolayers, such as shown in FIG. 1A, function through their ability to form a gold-thiol-alkyl linkage. Chlorosilane or alkoxysilane surface attachment to a metal oxide, such as shown in FIG. 1B, functions through the formation of a metal-oxygen-silicon linkage. Carboxylic acid esterification, such as shown in FIG. 1C, functions through the formation of a metal-ester linkage. Phosphonic acid deposition, such as shown in FIG. 1D, functions through the formation of not only a metal-oxygen-phosphate linkage but also a weak hydrogen bond between the phosphonic acid derivative and the oxide surface.

To date, the best-studied monolayer deposition technique, with resulting materials characterization, is the gold-alkane thiolate self-assembled monolayer. Self-assembled monolayers produced from gold-alkylthiolate attachment are an important element of materials used in such fields as nanoscience and nanotechnology.

Surface functionalization of oxide materials, with silanization the most common, has been utilized in diverse fields, such as separation science, catalysis, sensing, optics and tribology. Although silanization has multiple advantages for surface functionalization, including ease of surface attachment of the chloro or alkoxysilane functional group to surface hydroxyl groups, the disadvantages of silanization include incomplete functionalization of surface hydroxyls, difficulty in controlling monolayer formation, long deposition times, and inefficient electron transfer from the monolayers produced.

Carboxylic acid esterification and phosphonic acid deposition have helped establish some fields of study in the area of optoelectronics and associated industries. For example, the majority of dye-sensitized solar cells use carboxylic acid esterification to modify the surface of nanoporous oxide materials through a carboxylic acid anchoring group. Although carboxylic acid surface deposition has multiple advantages, including excellent electron transfer and ease in synthesizing materials containing this functionality, it can be difficult to deposit uniform monolayers of carboxylic acid containing molecules. The disadvantage of phosphonic acid deposition is the difficulty in synthesizing the phosphonic acid derivatives as well as lower electron transfer efficiency of the resulting hybrid materials, but this type of deposition does offer advantages of robust bonding that is more hydrolytically and thermally stable than monolayers formed from organosilanes.

Considering the state-of-the-art, a rapid and easy surface functionalization technique capable of producing strong chemical bonding of self-assembled monolayer hybrid materials possessing efficient electron transfer between the substrate and self-assembled monolayer is highly desired and its development would be a tremendous achievement for multiple fields of study. For example, the field of optoelectronics and separation science would benefit through rapid and efficient monolayer formation and increased active surface coverage of the organic material on the inorganic oxide substrate, thereby increasing the efficiency of optoelectronic devices and separations, respectively.

The current methods of depositing self-assembled monolayers onto inorganic oxides are time and material intensive. These methods typically involve refluxing or dip-coating the substrate in organic solvents containing high concentrations of the deposition material for periods of 4-18 hours, and even up to 24 hours or more. Still, these methods result in only partial surface modification, limited surface passivation (i.e., incomplete reaction of active surface sites, such as surface hydroxyls, with monolayer material such that a large fraction of the active surface sites are unreacted), and/or segments of the surface where the reactant has deposited onto itself (i.e., aggregation) forming a non-functioning multilayer. Such processes also constitute up to about 80% of the fabrication time of dye-sensitized solar cells (DSCs), leads to significant dye waste, and necessitates the use of toxic and difficult to dispose of organic solvents.

Further, with the improvements in DSC technology since the modern DSC design being introduced in 1991, including breakthroughs in alternative dyes, photoelectrodes, and electrolytes, efficiencies of laboratory-based DSC modules have only increased to about 12.3% over the last twenty years, including a minimal increase over the last 15 years. Although future work may uncover technology to significantly increase the efficiency of DSCs, there is a need to reduce the power generation costs in order to increase the feasibility of DSCs as an alternative energy generation technology.

Accordingly, there is a need in the industry for efficient, cost-effective, and sustainable materials and methods wherein a self-assembled monolayer is bonded to a metal oxide, wherein these materials are of high quality, durable, and provide surface passivation that promotes efficient electron transfer.

SUMMARY OF THE INVENTION

The present invention relates to self-assembled monolayer hybrid materials, a device for surface modification of inorganic oxide substrates through molecular vapor deposition of functionalized carboxylic acid derivatives resulting in the formation of a substrate-carboxylic acid derivative ester type linkage, and methods thereof.

The applicants have developed a novel, rapid, and low energy method for the modification of inorganic metal oxides wherein the deposition material is evaporated and/or sublimated, such that the deposition material is provided in a gas-phase and covalently bonds to the surface of an inorganic oxide substrate. This method provides self-assembled organic monolayer hybrid materials that greatly outperform solution-processed materials.

The present invention provides organic monolayer-inorganic substrate hybrid materials that may be useful in industries, such as in optoelectronics and separation science. In particular, the present invention provides self-assembled monolayers comprising a reactant deposited onto one or more inorganic oxide substrates, the reactant comprising functionalized carboxylic acids of Formula 1A and/or Formula 1B.

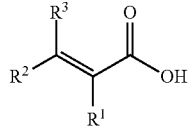

Formula 1A

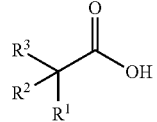

Formula 1B wherein the constituent members are provided herein below.

In some aspects, the functionalized carboxylic acid reactants that are deposited onto the inorganic substrate are deposited from a gas-phase via evaporation from a solution or sublimation from a solid. In some aspects, the functionalized carboxylic acid reactants evaporate or sublimate prior to thermal degradation and contain a highly electron withdrawing functionality on the α-carbon to the carboxylate. In some aspects, the functionalized carboxylic acid reactants have a relatively low molecular weight and a relatively good thermal stability.

In some aspects, the functionalized carboxylic acid reactant has a molecular weight of up to 1500 g/mol, in some aspects up to 1250 g/mol, in some aspects up to 1000 g/mol, in some aspects up to 900 g/mol, in some aspects up to 8000 g/mol, and in some other aspects up to 700 g/mol.

In some aspects, the functionalized carboxylic acid reactant has a thermal stability up to about 500° C., in some aspects up to about 450° C., in some aspects up to about 400° C., in some aspects up to about 350° C., in some aspects up to about 300° C., in some aspects up to about 250° C., in some aspects up to about 200° C., in some aspects up to about 150° C., and in some other aspects up to about 100° C.

In some aspects, the hybrid materials of the present invention have a uni-dentate, bi-dentate and/or tri-dentate attachment to the inorganic substrate. Upon the attachment of the reactant to the inorganic substrate, the reactant constituent members $R^1$, $R^2$ and/or $R^3$ of Formula 1A and/or Formula 1B remain the same as in the resulting monolayer-inorganic substrate hybrid materials that are formed according to certain aspects of the present invention. In some aspects, without wishing to be bound by theory, the bi-dentate and/or tri-dentate attachment to the inorganic substrate is believed to include an unprecedented α-carbon to substrate metal covalent bond or a bond from the highly electron withdrawing substituent on the α-carbon to the surface of the inorganic oxide substrate.

The present invention relates to a material comprising a monolayer of an α-carbon modified carboxylic acid derivative deposited on a metal oxide substrate, the monolayer having unidentate, bi-dentate or tri-dentate covalent bonding to the substrate.

In some aspects, in the situation of unidentate bonding, a bond is formed between the hydroxyl functional group of the reactant and the metal of the substrate, as represented in Formula 2A and/or Formula 2B, the constituent members $R^1$, $R^2$ and $R^3$ corresponding to the constituent members $R^1$, $R^2$ and $R^3$ in the reactant of Formula 1A.

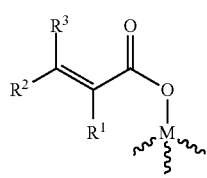

Formula 2A

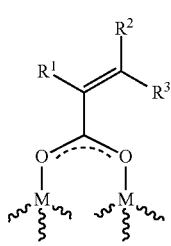

Formula 2B

In some aspects, in the situation of unidentate bonding, a bond is formed between the hydroxyl functional group of the reactant and the metal of the substrate, as represented in Formula 2C and/or Formula 2B, the constituent members $R^1$, $R^2$ and $R^3$ corresponding to the constituent members $R^1$, $R^2$ and $R^3$ in the reactant of Formula 1B.

Formula 2C

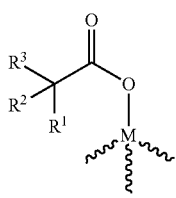

Formula 2D

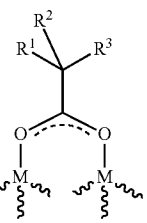

In some aspects, without wishing to be bound by theory, it is believed that the bi-dentate and/or tri-dentate bonding may have at least one bond formed between the hydroxyl functional group of the reactant and the metal of the substrate and at least one bond formed between one of the constituent members $R^1$, $R^2$ or $R^3$ of the reactant and a hydroxyl functional group of the substrate, as represented in Formula 3A, Formula 3B and/or Formula 3C, the constituent members $R^1$, $R^2$ and $R^3$ corresponding to the constituent members $R^1$, $R^2$ and $R^3$ in the reactant of Formula 1A.

Formula 3A

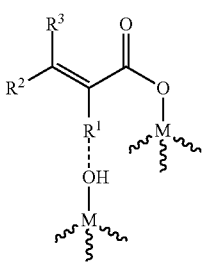

Formula 3B

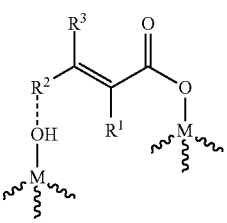

Formula 3C

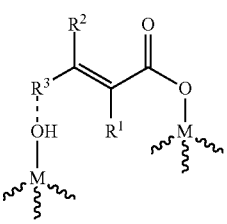

In some aspects, without wishing to be bound by theory, it is believed that the bi-dentate and/or tri-dentate bonding may have at least one bond formed between the hydroxyl functional group of the reactant and the metal of the substrate and at least one bond formed between one of the constituent members $R^1$, $R^2$ or $R^3$ of the reactant and a hydroxyl functional group of the substrate, as represented in Formula 3D, Formula 3E and/or Formula 3F, the constituent members $R^1$, $R^2$ and $R^3$ corresponding to the constituent members $R^1$, $R^2$ and $R^3$ in the reactant of Formula 1B.

Formula 3D

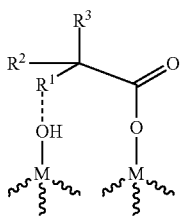

Formula 3E

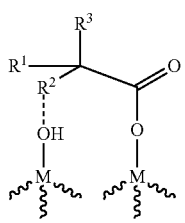

Formula 3F

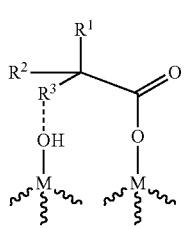

In some aspects, without wishing to be bound by theory, it is believed that the bi-dentate and/or tri-dentate bonding may have at least one bond formed between the hydroxyl functional group of the reactant and the metal of the substrate and at least one bond formed between one of the constituent members $R^1$, $R^2$ or $R^3$ of the reactant and the metal of the substrate, as represented in Formula 4A, Formula 4B and/or Formula 4C, the constituent members $R^1$, $R^2$ and $R^3$ corresponding to the constituent members $R^1$, $R^2$ and $R^3$ in the reactant of Formula 1A.

Formula 4A

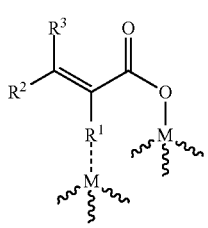

Formula 4B

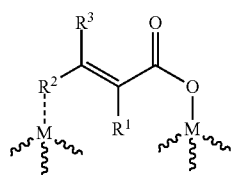

-continued

Formula 4C

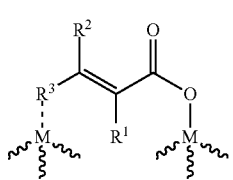

In some aspects, without wishing to be bound by theory, it is believed that the bi-dentate and/or tri-dentate bonding may have at least one bond formed between the hydroxyl functional group of the reactant and the metal of the substrate and at least one bond formed between one of the constituent members $R^1$, $R^2$ or $R^3$ of the reactant and the metal of the substrate, as represented in Formula 4D, Formula 4E and/or Formula 4F, the constituent members $R^1$, $R^2$ and $R^3$ corresponding to the constituent members $R^1$, $R^2$ and $R^3$ in the reactant of Formula 1B.

Formula 4D

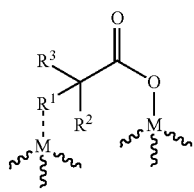

Formula 4E

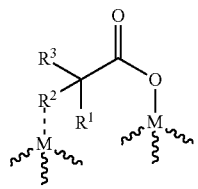

Formula 4F

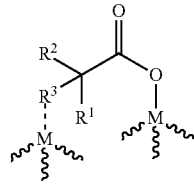

In some aspects, without wishing to be bound by theory, it is believed that the bi-dentate and/or tri-dentate bonding may have at least one bond formed between the hydroxyl functional group of the reactant and unprecedented covalent bonding between the α-carbon of the modified carboxylic acid derivative and the metal of the metal oxide. In certain aspects, the self-assembled monolayer of the α-carbon modified carboxylic acid derivative is attached to the metal substrate, which in the instance of Formula 1B includes the release of $R^3$, as represented in Formula 5.

Formula 5

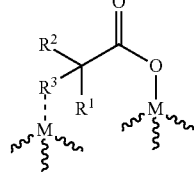

In some aspects, one of the bonds of the bi-dentate and/or tri-dentate bonding may occur between the oxygen of the carbonyl group and the substrate.

In some aspects, a monolayer of an α-carbon modified carboxylic acid derivative can be deposited on a metal oxide substrate, wherein there is no hydrogen on the α-carbon of Formula 1A and/or Formula 1B.

The present invention further provides a method for depositing at least one functionalized carboxylic acid derivative onto at least one metal oxide substrate to produce a hybrid material. In certain aspects, functionalized carboxylic acid derivatives of the present invention deposit from the gas phase onto at least one surface of at least one metal oxide substrate by molecular vapor deposition. In certain aspects, deposition of the functionalized carboxylic acid derivatives from the gas phase onto metal oxide substrates by molecular vapor deposition produces an organic-monolayer/inorganic-substrate hybrid material, the organic monolayers having uni-dentate, bi-dentate and/or tri-dentate attachment to the inorganic substrate, which according to certain aspects and without wishing to be bound by theory may have unprecedented α-carbon to surface metal covalent bonding for bi- and tri-dentate attachment if an appropriate substituent (e.g., hydrogen as $R^3$) is originally present on the α-carbon of the functionalized carboxylic acid.

The present invention further provides a material having a self-assembled monolayer of an α-carbon modified carboxylic acid derivative attached to a metal oxide substrate, whereby the self-assembled monolayer provides a bonded phase on the metal oxide substrate for use as a stationary phase in the separation sciences. The self-assembled monolayer deposited onto the metal oxide substrate results in an increased passivation of the metal oxide substrate as compared to the state of the art. It is also contemplated to result in an increase in the concentration of bonded phase as compared to state-of-the-art stationary phases. This invention may allow the production of highly efficient stationary phases, to include chiral, cyano, diol, and/or C1-20, etc. stationary phases.

The present invention further provides a material having self-assembled monolayers of α-carbon modified carboxylic acid derivatives attached to a metal oxide substrate, whereby the self-assembled monolayer provides a photoactive material covalently bonded to the metal oxide substrate for use in optoelectronics. In some aspects, ultrathin film transistors can be fabricated from the self-assembled monolayer/metal oxide substrate hybrid material. In some aspects, the monolayer hybrid material is believed to produce uni-dentate, bi-dentate and/or tri-dentate surface attachment, which provides materials capable of rapid and direct electron transfer from the self-assembled monolayers to the metal oxide substrates—features atypical of current gas-phase monolayer deposition techniques.

The present invention further provides for a method of determining the optimal period of time of depositing the reactant from a gas-phase onto the substrate for providing self-assembled monolayers of α-carbon modified carboxylic acid derivatives attached to the metal oxide substrate, the optimal period of time corresponding to the breakpoint in the slope of the absorbance of the reactant onto the substrate relative to vapor deposition time.

DETAILED DESCRIPTION OF THE INVENTION

Figure 1D:
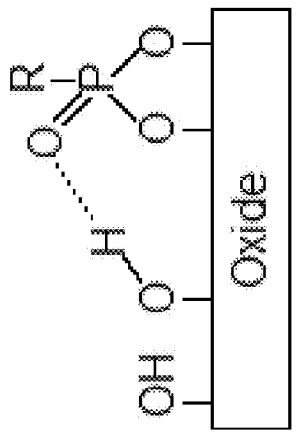
FIG. 1 shows self-assembling monolayer illustrations of the prior art, including the gold-alkylthiolate self-assembling monolayers illustrated in FIG. 1A, chlorosilane or alkoxysilane surface attachment to a metal oxide illustrated in FIG. 1B, carboxylic acid esterification functioning through the formation of a metal-ester linkage illustrated in FIG. 1C, and phosphonic acid deposition functioning through the formation of not only a metal-oxygen-phosphate linkage but also a weak hydrogen bond between the phosphonic acid derivative and the oxide surface illustrated in FIG. 1D.
Figure 1C:
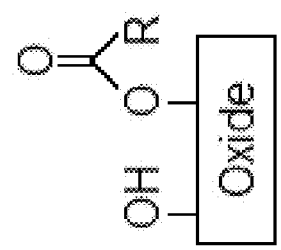
Figure 1B:
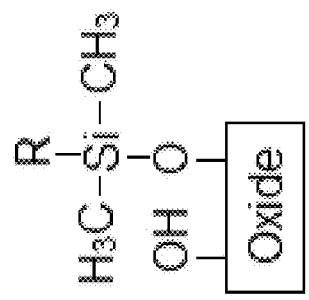
Figure 1A:
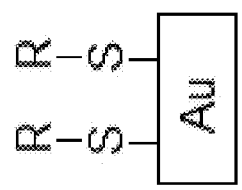

The present invention is directed at self-assembled organic monolayer hybrid materials deposited on an inorganic substrate and methods thereof. In particular, the present invention is directed at self-assembled monolayer hybrid materials, wherein surface modification of inorganic oxide substrates occurs through molecular vapor deposition of a reactant via evaporation of a solution and/or sublimation of a solid, the reactant comprising at least one functionalized carboxylic acid derivative, resulting in the formation of a substrate-carboxylic acid derivative ester type linkage, and in some aspects a unique substrate-carboxylic acid derivative metal-carbon linkage.

In some aspects, the present invention provides a self-assembled organic monolayer deposited on an inorganic substrate by a gas-phase deposition technique, the self-assembled organic monolayer deposited from a reactant comprising a targeted α-carbon modified carboxylic acid of Formula 1A and/or Formula 1B:

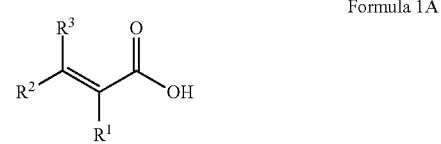

Formula 1A

-continued

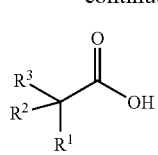

Formula 1B wherein;

$R^1$ in Formula 1A and/or Formula 1B is an electron withdrawing functional group. In some aspects the electron withdrawing functional group is chosen from a nitrile, a nitro, a halogen, a hydroxyl, a sulfonic acid, $NR_aR'_a$, $SR_b$, $COR_c$, and $COOR_d$.

In some aspects of the present invention, $R^2$ in Formula 1A and/or Formula 1B may be an electroactive functional group. In some aspects the electroactive functional group is chosen from a hydrogen, a halo, $NR_aR'_a$, $SR_b$, $COR_c$, $COOR_d$, $CR_e$, $C_{0-20}$ hydroxyl, $C_{1-20}$ alkyl, $C_{1-20}$ haloalkyl, $C_{1-20}$ halocycloalkyl, $C_{1-20}$ haloheterocycl, $CO-(C_{1-20}$ alkyl), $C_{1-20}$ cycloalkyl, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, $C_{1-20}$ heteroaryl, a metallocene of the aforementioned groups, and a porphyrin derivative, wherein;

$R_a$ and $R'_a$ may be each, independently chosen from the group consisting of H, O, $C_{1-20}$ hydroxyl, $C_{1-20}$ alkyl, $CO-(C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, $C_{1-20}$ heteroaryl;

$R_b$ may be chosen from the group consisting of H, Cd, Hg, As, Zn, $Na_2$, Pb, $O_3$—H, $C_{1-20}$ hydroxyl, $C_{1-20}$ alkyl, $CO-(C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, $C_{1-20}$ heteroaryl;

$R_c$, may be chosen from the group consisting of H, $C_{1-20}$ hydroxyl, $C_{1-20}$ alkyl, $CO-(C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, $C_{1-20}$ heteroaryl;

$R_d$ may be chosen from the group consisting of H, $C_{1-20}$ hydroxyl, $C_{1-20}$ alkyl, $CO-(C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, $C_{1-20}$ heteroaryl;

$R_e$ may be chosen from the group consisting of $H_3$, $F_3$, $Cl_3$, N, $C_{0-20}$ hydroxyl, $C_{1-20}$ alkyl, $CO-(C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, $C_{1-20}$ heteroaryl;

$R_f$, $R_g$, $R_h$ may be each independently a, halo, $NR_aR'_a$, $SR_b$, $COR_c$, $COOR_d$, $CR_e$, $C_{0-20}$ hydroxyl, $C_{1-20}$ alkyl, $C_{1-20}$ haloalkyl, $C_{1-20}$ halocycloalkyl, $C_{1-20}$ haloheterocycl, $CO-(C_{1-20}$ alkyl), $C_{1-20}$ alkyl, $C_{1-20}$ cycloalkyl, $C_{1-20}$ alkene, $C_{1-20}$ conjugated alkene, $C_{1-20}$ heterocycl, $C_{1-20}$ conjugated heterocycl, $C_{1-20}$ aryl, and a $C_{1-20}$ heteroaryl; the central atom of the porphyrin derivative is chosen from the group consisting of a transition metal, a post-transition metal, and a metalloid. In some aspects the central atom has a charge of $2^+$. In some further aspects the central atom has a charge of $3^+$.

In some other aspects of the present invention, $R^2$ in Formula 1A and/or Formula 1B may be a non-electroactive functional group. In some aspects the non-electroactive group is chosen from a group consisting of a hydrogen, a halo, $NR_aR'_a$, $SR_b$, $COR_c$, $COOR_d$, $CR_e$, $C_{0-20}$ hydroxyl, $C_{1-20}$ alkyl, $C_{1-20}$ haloalkyl, $C_{1-20}$ halocycloalkyl, $C_{1-20}$ haloheterocycl, $CO-(C_{1-20}$ alkyl), $C_{1-20}$ cycloalkyl, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, $C_{1-20}$ heteroaryl, and a metallocene of the aforementioned groups, and a porphyrin derivative, wherein;

$R_a$ and $R'_a$ may be each, independently chosen from the group consisting of H, O, $C_{1-20}$ hydroxyl, $C_{1-20}$ alkyl, $CO-(C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, $C_{1-20}$ heteroaryl;

$R_b$ may be chosen from the group consisting of H, Cd, Hg, As, Zn, $Na_2$, Pb, $O_3$—H, $C_{1-20}$ hydroxyl, $C_{1-20}$ alkyl, $CO-(C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, $C_{1-20}$ heteroaryl;

$R_c$ may be chosen from the group consisting of H, $C_{1-20}$ hydroxyl, $C_{1-20}$ alkyl, $CO-(C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, $C_{1-20}$ heteroaryl;

$R_d$ may be chosen from the group consisting of H, $C_{1-20}$ hydroxyl, $C_{1-20}$ alkyl, $CO-(C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, $C_{1-20}$ heteroaryl;

$R_e$ may be chosen from the group consisting of $H_3$, $F_3$, $Cl_3$, N, $C_{0-20}$ hydroxyl, $C_{1-20}$ alkyl, $CO-(C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, $C_{1-20}$ heteroaryl;

$R_f$, $R_g$, $R_h$ may be each independently a, halo, $NR_aR'_a$, $SR_b$, $COR_c$, $COOR_d$, $CR_e$, $C_{0-20}$ hydroxyl, $C_{1-20}$ alkyl, $C_{1-20}$ haloalkyl, $C_{1-20}$ halocycloalkyl, $C_{1-20}$ haloheterocycl, $CO-(C_{1-20}$ alkyl), $C_{1-20}$ alkyl, $C_{1-20}$ cycloalkyl, $C_{1-20}$ alkene, $C_{1-20}$ conjugated alkene, $C_{1-20}$ heterocycl, $C_{1-20}$ conjugated heterocycl, $C_{1-20}$ aryl, a $C_{1-20}$ heteroaryl, and a $C_{1-20}$ heterocycloaryl; the central atom of the porphyrin derivative is chosen from the group consisting of a transition metal, a post-transition metal, and a metalloid. In some aspects the central atom has a charge of $2^+$. In some further aspects the central atom has a charge of $3^+$.

In some aspects of the present invention, $R^2$ in Formula 1A and/or Formula 1B may be a superhydrophobic group chosen from the structures in Formula 6, among other superhydrophobic groups known to one of ordinary skill in the art.

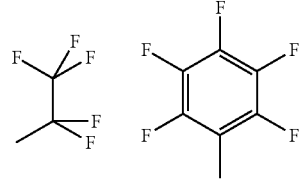

Formula 6

In some aspects of the present invention, $R^2$ in Formula 1A and/or Formula 1B contains one or more chiral groups, the chiral group is comprised of an atom within $R^2$ having three different substitutes R', R" and R'" attached thereto. In some aspects, the three substitutes (R', R" and R'") attached to the carbon are chosen from the foregoing list of $R^2$ substituents.

In some aspects of the present invention, $R^2$ in Formula 1A and/or Formula 1B may include a chiral group with R', R" and R'" chosen from the various substitutes in Formula 7.

Formula 7

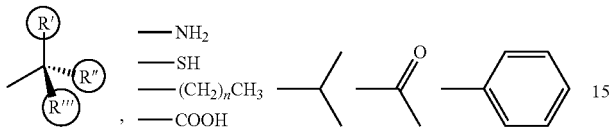

In some aspects of the present invention, $R^2$ in Formula 1A and/or Formula 1B may be a group capable of π-stacking chosen from the structures in Formula 8, among other groups capable of π-stacking known to one of ordinary skill in the art.

Formula 8

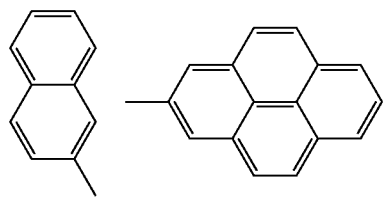

In some aspects of the present invention, $R^2$ in Formula 1A and/or Formula 1B may be an electron accepting group chosen from the structures in Formula 9, among other electron accepting groups known to one of ordinary skill in the art.

Formula 9

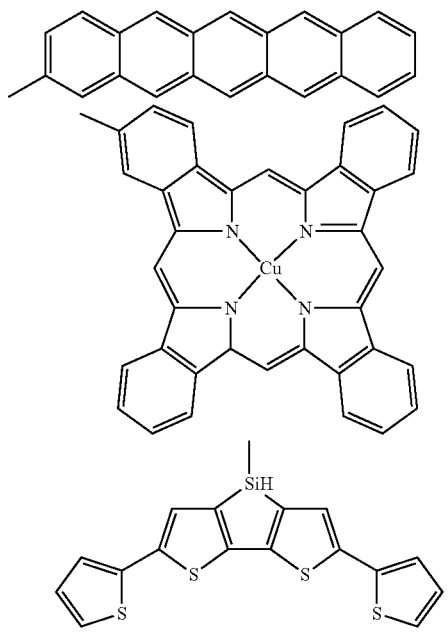

In some aspects of the present invention, $R^2$ in Formula 1A and/or Formula 1B may be an electron donating group chosen from the structures in Formula 10, among other electron donating groups known to one of ordinary skill in the art.

Formula 10

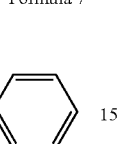
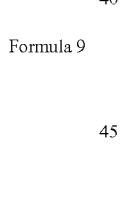

In some aspects of the present invention, $R^3$ of Formula 1B may be an electroactive group. In some aspects the electroactive group is chosen from a group consisting of a hydrogen, a halo, $NR_aR'_a$, $SR_b$, $COR_c$, $COOR_d$, $CR_e$, $C_{0-20}$ hydroxyl, $C_{1-20}$ alkyl, $C_{1-20}$ haloalkyl, $C_{1-20}$ halocycloalkyl, $C_{1-20}$ haloheterocycl, CO—($C_{1-20}$ alkyl), $C_{1-20}$ cycloalkyl, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, $C_{1-20}$ heteroaryl, a metallocene of the aforementioned groups, and a porphyrin derivative, wherein;

$R_a$ and $R'_a$ may be each, independently chosen from the group consisting of H, O, $C_{1-20}$ hydroxyl, $C_{1-20}$ alkyl, CO—($C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, $C_{1-20}$ heteroaryl; $R_b$ may be chosen from the group consisting of H, Cd, Hg, As, Zn, $Na_2$, Pb, $O_3$—H, $C_{1-20}$ hydroxyl, $C_{1-20}$ alkyl, CO—($C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, $C_{1-20}$ heteroaryl;

$R_c$ may be chosen from the group consisting of H, $C_{1-20}$ hydroxyl, $C_{1-20}$ alkyl, CO—($C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, $C_{1-20}$ heteroaryl;

$R_d$ may be chosen from the group consisting of H, $C_{1-20}$ hydroxyl, $C_{1-20}$ alkyl, CO—($C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, $C_{1-20}$ heteroaryl;

$R_e$ may be chosen from the group consisting of $H_3$, $F_3$, $Cl_3$, N, $C_{0-20}$ hydroxyl, $C_{1-20}$ alkyl, CO—($C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, $C_{1-20}$ heteroaryl;

$R_f$, $R_g$, $R_h$ may be each independently a halo, $NR_aR'_a$, $SR_b$, $COR_c$, $COOR_d$, $CR_e$, $C_{0-20}$ hydroxyl, $C_{1-20}$ alkyl, $C_{1-20}$ haloalkyl, $C_{1-20}$ halocycloalkyl, $C_{1-20}$ haloheterocycl, CO—($C_{1-20}$ alkyl), $C_{1-20}$ alkyl, $C_{1-20}$ cycloalkyl, $C_{1-20}$ alkene, $C_{1-20}$ conjugated alkene, $C_{1-20}$ heterocycl, $C_{1-20}$ conjugated heterocycl, $C_{1-20}$ aryl, and a $C_{1-20}$ heteroaryl;

the central atom of the porphyrin derivative is chosen from the group consisting of a transition metal, a post-transition metal, and a metalloid. In some aspects the central atom has a charge of 2+. In some further aspects the central atom has a charge of 3+.

In some other aspects of the present invention, $R^3$ of Formula 1B may be a non-electroactive group. In some aspects the non-electroactive group is chosen from a group consisting of a hydrogen, a halo, $NR_aR'_a$, $SR_b$, $COR_c$, $COOR_d$, $CR_e$, $C_{0-20}$ hydroxyl, $C_{1-20}$ alkyl, $C_{1-20}$ haloalkyl, $C_{1-20}$ halocycloalkyl, $C_{1-20}$ haloheterocycl, $CO$—$(C_{1-20}$ alkyl), $C_{1-20}$ cycloalkyl, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, $C_{1-20}$ heteroaryl, and a metallocene of the aforementioned groups, and a porphyrin derivative, wherein;

$R_a$ and $R'_a$ may be each, independently chosen from the group consisting of H, O, $C_{1-20}$ hydroxyl, $C_{1-20}$ alkyl, CO—($C_{1-20}$ alkyl), $C_{1-20}$ alkane, alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, $C_{1-20}$ heteroaryl;

$R_b$ may be chosen from the group consisting of H, Cd, Hg, As, Zn, $Na_2$, Pb, $O_3$—H, $C_{1-20}$ hydroxyl, $C_{1-20}$ alkyl, CO—($C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, $C_{1-20}$ heteroaryl;

$R_c$ may be chosen from the group consisting of H, $C_{1-20}$ hydroxyl, $C_{1-20}$ alkyl, CO—($C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, $C_{1-20}$ heteroaryl;

$R_d$ may be chosen from the group consisting of H, $C_{1-20}$ hydroxyl, $C_{1-20}$ alkyl, CO—($C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, $C_{1-20}$ heteroaryl;

$R_e$ may be chosen from the group consisting of $H_3$, $F_3$, $Cl_3$, N, $C_{0-20}$ hydroxyl, $C_{1-20}$ alkyl, CO—($C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, $C_{1-20}$ heteroaryl;

$R_f$, $R_g$, $R_h$ may be each independently a halo, $NR_aR'_a$, $SR_b$, $COR_c$, $COOR_d$, $CR_e$, $C_{0-20}$ hydroxyl, $C_{1-20}$ alkyl, $C_{1-20}$ haloalkyl, $C_{1-20}$ halocycloalkyl, $C_{1-20}$ haloheterocycl, CO—($C_{1-20}$ alkyl), $C_{1-20}$ alkyl, $C_{1-20}$ cycloalkyl, $C_{1-20}$ alkene, $C_{1-20}$ conjugated alkene, $C_{1-20}$ heterocycl, $C_{1-20}$ conjugated heterocycl, $C_{1-20}$ aryl, a $C_{1-20}$ heteroaryl, and a $C_{1-20}$ heterocycloaryl; the central atom of the porphyrin derivative is chosen from the group consisting of a transition metal, a post-transition metal, and a metalloid. In some aspects the central atom has a charge of 2+. In some further aspects the central atom has a charge of 3+.

In some aspects of the present invention, $R^3$ of Formula 1B may be a superhydrophobic group chosen from the structures in Formula 6, among other superhydrophobic groups.

Formula 6

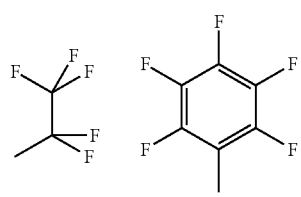

In some aspects of the present invention, $R^3$ in Formula 1B contains one or more chiral groups, the chiral group is comprised of an atom within $R^3$ having three different substitutes R', R" and R'" attached thereto. In some aspects, the three substitutes (R', R" and R'") attached to the carbon are chosen from the foregoing list of $R^3$ substituents.

In some aspects of the present invention, $R^3$ may include a chiral group with R', R" and R'" chosen from the various substitutes in Formula 7.

Formula 7

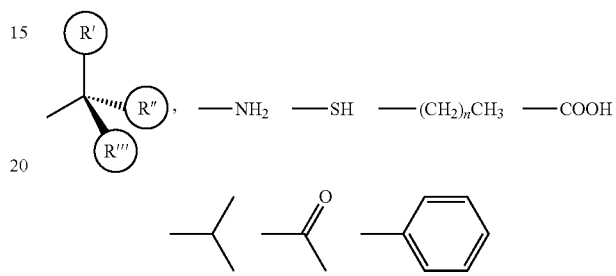

In some aspects of the present invention, $R^3$ may be a group capable of π-stacking chosen from the structures in Formula 8, among other groups capable of π-stacking known to one of ordinary skill in the art.

Formula 8

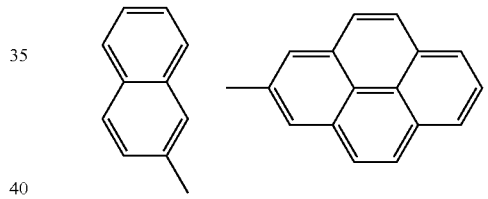

In some aspects of the present invention, $R^2$ in Formula 1A and/or Formula 1B may be an electron accepting group chosen from the structures in Formula 9, among other electron accepting groups known to one of ordinary skill in the art.

Formula 9

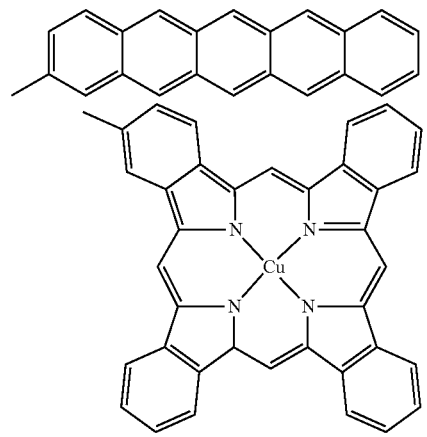

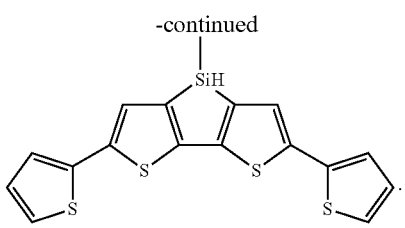

In some aspects of the present invention, $R^2$ in Formula 1A and/or Formula 1B may be an electron donating group chosen from the structures in Formula 10, among other electron donating groups known to one of ordinary skill in the art.

Formula 10

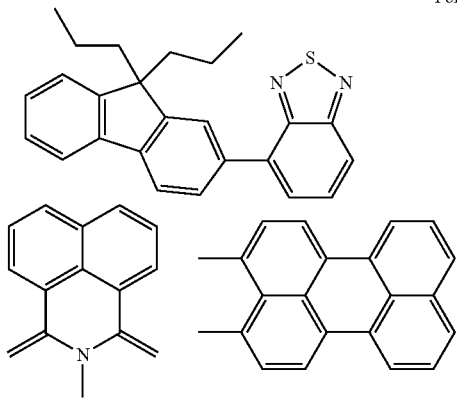

In certain aspects, the reactant of Formula 1A and/or Formula 1B in the gas-phase is deposited onto and attaches to the metal-oxide substrate. In certain aspects when the reactant is deposited on the metal-oxide substrate, the reactant covalently bonds to the substrate. In some aspects, the reactant forms a uni-dentate bond with the substrate. In some aspects, the unidentate bond is formed between the hydroxyl functional group of the reactant and the metal (M).

In some aspects, without wishing to be bound by theory, in the situation of unidentate bonding a covalent bond may be formed from a surface hydroxyl of the substrate to the carbonyl carbon of the functionalized carboxylic acid reactants of Formula 1A and/or Formula 1B.

In some aspects, without wishing to be bound by theory, the bi-dentate and/or tri-dentate bonding may have unprecedented covalent bonding between the α-carbon of the modified carboxylic acid derivative and the metal of the metal oxide. In certain aspects, the self-assembled monolayer of the α-carbon modified carboxylic acid derivative is attached to the metal substrate.

In some aspects, although not shown, one of the bonds of the bi-dentate and/or tri-dentate bonding may occur between the oxygen of the carbonyl group of the reactant and the substrate.

In some other aspects, the reactant forms bi-dentate bonding with the substrate. In some aspects, the bi-dentate bonding comprises a first bond formed between the hydroxyl group of the reactant and the metal (M), and a bond between the carbonyl oxygen of the reactant and a respective metal of the inorganic substrate. In some other aspects, the bi-dentate bonding comprises a first bond formed between the hydroxyl group of the reactant and the metal (M), and without wishing to be bound to theory the second bond is believed to be a covalent bond formed between the α-carbon of the reactant and a metal of the metal-oxide substrate. In some other aspects, the bi-dentate bonding comprises a first bond formed between the hydroxyl group of the reactant and the metal (M), and the second bond is formed between the surface hydroxyl of the substrate and one of the constituent members $R^1$, $R^2$ or $R^3$ of the reactant. In some other aspects, the bi-dentate bonding comprises a first bond formed between the hydroxyl group of the reactant and the metal (M), and the second bond is formed between one of the constituent members $R^1$, $R^2$ or $R^3$ of the reactant and the metal of the substrate.

In some other aspects, the reactant forms a tri-dentate bonding with the metal-oxide substrate. In some aspects, without wishing to be bound by theory it is believed that a covalent bond is formed between the α-carbon of the reactant and a metal of the metal-oxide substrate, and bonds are also formed between each of the oxygens in the hydroxyl group and the carbonyl group of the reactant and a respective metal of the inorganic substrate.

In a further aspect the uni-dentate bond may consist of a covalent bond. In some aspects the covalent bond may form between $R_k$—$R^1$.

In a further aspect the bi-dentate bond may consist of two covalent bonds. In some aspects one covalent bond may form between an $R_k$—$R^1$. In some aspects the second covalent bond may form between either, $R_i$ and the α-carbon of Formula 1 (Formula 1A or Formula 1B), or $R_j$ and the α-carbon of Formula 1.

In certain aspects of the present invention, the substrate is a metal oxide. In some aspects the metal oxide may be chosen from the group consisting of $R_{in}R_{jn}R_{kn}$, wherein:

$R_{in}$ may be chosen from the group consisting of B, P, Ga, Sb, As, S, Se, Te, Y, Si, Zn, Mg, Cd, Ti, Cu, U, Bi, Sn, Ba, Sr, Li, La, Fe, Ni, Nb, Eu, and In, wherein 0<n<3;

$R_{jn}$ may be absent or chosen from the group consisting of B, P, Ga, Sb, As, S, Se, Te, Y, Si, Zn, Mg, Cd, Ti, Cu, U, Bi, Sn, Ba, Sr, Li, La, Fe, Ni, Nb, Eu, and In, wherein 0<n<3; and $R_{kn}$ may be chosen from the group consisting of O, wherein 0<n<4.

In some further aspects the substrate may be a p-n type semiconductor.

In some aspects of the present invention, the inorganic substrate comprises a metal oxide chosen from silicon dioxide ($SiO_2$), zinc oxide (ZnO), titanium dioxide ($TiO_2$), aluminum oxide ($Al_2O_3$), various iron oxides ($Fe_xO_yH_z$), tin oxide ($SnO_2$), indium oxide ($I_2O_3$), indium doped tin oxide (ITO; approximately 90% $I_2O_3$ and 10% $SnO_2$), copper oxide ($Cu_2O$ or CuO), tungsten oxide ($WO_3$), silver oxide ($Ag_2O_3$), palladium oxide (PdO), chromium oxide ($Cr_2O_3$), manganese oxide (MnO), thallium oxide ($Tl_2O_3$), vanadium oxide ($V_2O_5$), antimony oxide ($Sb_2O_3$), mixtures, alloys, or doped forms thereof. In some aspects of the present invention, the metal oxide has a surface that is nanoporous. In some aspects of the present invention, the metal oxide has a surface that is not porous.

In certain aspects, the inorganic substrate is provided as a layer on another substrate. In some other aspects, the inorganic substrate comprises a portion of another substrate, such as the inorganic substrate being provided as a partial layer on an underlying substrate, the inorganic substrate encapsulating at least a portion of an underlying substrate, the inorganic substrate at least partially encapsulated by another substrate, the inorganic substrate at least partially coated by another substrate, or the like. Based upon the forgoing, one of ordinary skill in the art will appreciate that the substrate may comprise various different materials with at least an exposed portion comprising an inorganic oxide to which the reactant can be deposited to form the self-assembled organic monolayer thereon.

The reactant bonding to the substrate may be self-limiting, while in some other aspects, deposition of the reactant onto the substrate is not self-limiting.

In one aspect of the present invention, a monolayer of the reactant of Formula 1A and/or Formula 1B is formed on the metal-oxide substrate. In some other aspects, a monolayer of the reactant of Formula 1A and/or Formula 1B is formed on at least a portion of the metal-oxide substrate.

Figure 2:
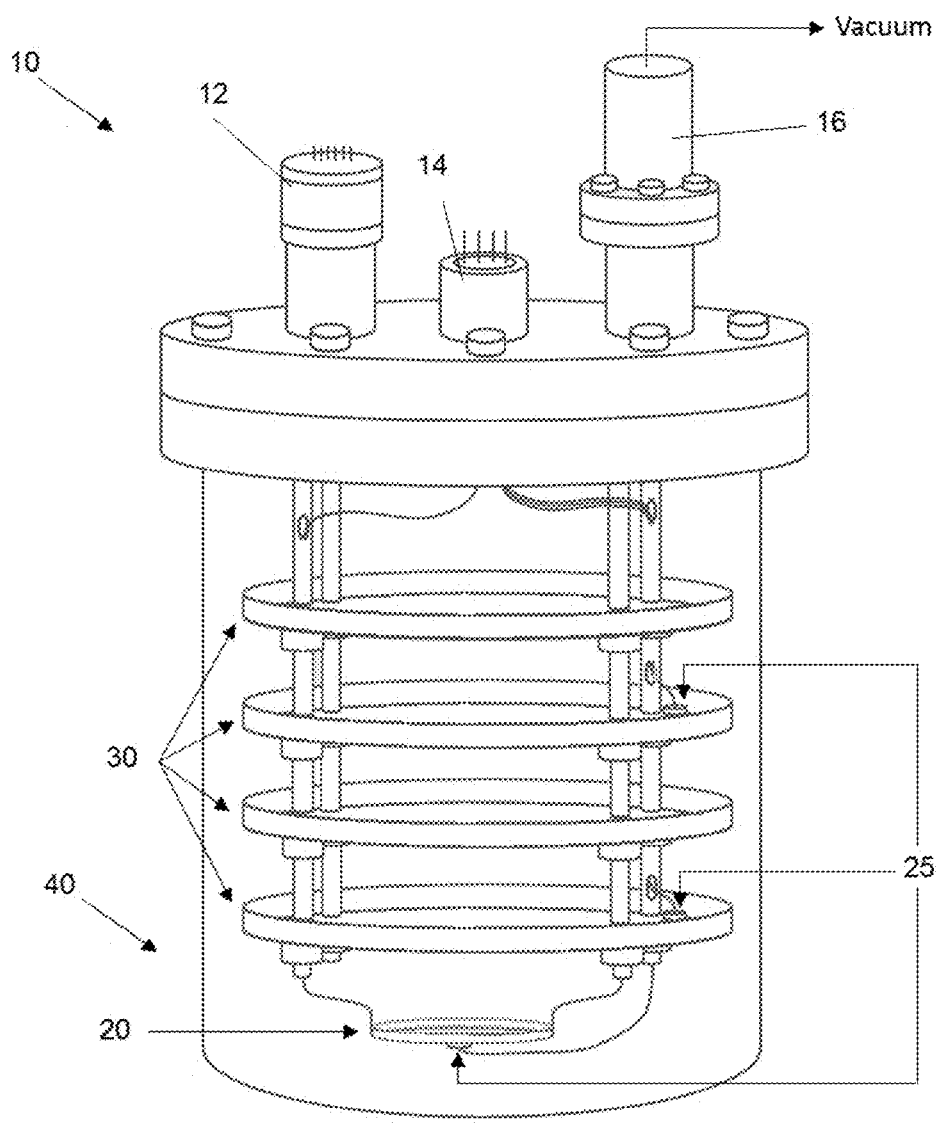
FIG. 2 is a device for forming the monolayer on the metal-oxide substrate, according to certain aspects of the present invention.

The monolayer may be formed on the metal-oxide substrate by using a device 10 such as that illustrated in FIG. 2, the device 10 having a reactant holder 20 for holding the reactant 22, which may also have a resistive heater, located at the bottom end of chamber 40 and below one or more substrate material holders 30 for holding the substrate 33 within the chamber 40. The reactant holder 20 and substrate material holders 30 may have thermocouples 25 for heating. The device may also have a pressure transducer 12, an electrical feed-through 14, and a vacuum transfer line 16, which are illustrated in FIG. 2 as being located at the top part of the device 10. Although not shown, the device may further comprise a cold trap 50 to allow direct condensation of the reactant 22 to a small area after deposition on the substrate 33 concludes.

The monolayer may be formed on the metal-oxide substrate by placing one or more reactant materials 22 in a reactant holder 20 in a chamber 40, placing the substrate 33 on a substrate material holder 30, placing the substrate rack 30 in a chamber 40, evacuating the chamber 40, placing the chamber 40 under vacuum, heating the device 10, heating the reactant holder 20, heating the substrate 33 in the substrate rack 30, converting the reactant 22 into a gas phase, and depositing the reactant 22 in the gas phase onto the substrate 33.

The reactant material 22 may be placed in the reactant holder 20 as either a solid, a liquid, dissolved in a solution or suspended in a solvent. During the formation of the organic monolayer, the reactant may vaporize into the gas phase or sublime into the gas phase before being deposited on the substrate.

In certain aspects, the device used to deposit the reactant onto the substrate comprises a chamber, a temperature control unit, a humidity control unit, a pressure control unit and/or an evacuation unit. In some aspects, the chamber has a substrate rack and a reactant holder. The substrate rack may have one, two or multiple shelves. The shelves of the substrate rack may be adjustable.

In another aspect the shelves of the substrate rack may be rimmed.

In another aspect, the temperature of the substrate rack may be controlled independent of the chamber temperature. In some aspects the temperature of the substrate rack is controlled using a heater. In some further aspects the temperature of the substrate rack may be controlled by an external rheostat.

In another aspect of the device the temperature of the substrate rack may be monitored by a thermocouple.

In another aspect of the device the temperature of the reactant holder is controlled independent of the chamber temperature. In some aspects the reactant holder may be heated using a resistive heater. In some further aspects the resistive heater may be controlled by an external rheostat.

In another aspect of the device the temperature of the reactant holder may be monitored by a thermocouple.

In another aspect of the device the chamber is capable of being placed under vacuum. In some aspects the base pressure may reach below 1 mTorr and process pressure may reach less than 1 Torr. In some aspects, the vacuum may be at about atmospheric pressure to about $10^{-8}$ Torr, depending upon the volatility and thermal stability of the reactant. The vacuum allows evaporation or sublimation prior to thermal degradation of the deposition material.

In another aspect, the chamber is capable of being heated. In some aspects the temperature may rise above 250° C. In some other aspects, the temperature does not exceed 250° C. In some other aspects, the temperature is held below the thermal degradation point of the reactant material but high enough to allow evaporation/sublimation.

In some aspects, the chamber is heated to a temperature up to about 500° C., in some aspects up to about 450° C., in some aspects up to about 400° C., in some aspects up to about 350° C., in some aspects up to about 300° C., in some aspects up to about 250° C., in some aspects up to about 200° C., in some aspects up to about 150° C., and in some other aspects up to about 100° C.

In another aspect, the precursor gas is purged into the deposition chamber in form of gas pulses. A carrier gas such as Ar may be used during the monolayer deposition.

In another aspect, the device is made of a metal allow. In some aspects the device may be made from stainless steel.

In another aspect, the device is heated. In some aspects the device may be heated by placing it in an oven. In some further aspects the device may be heated by covering it with heating tape.

In another aspect, the humidity within the chamber may be controlled by controlling the vacuum level (baseline pressure) and the water loading of the evacuation gasses and/or the addition of a small volume of water to the chamber.

In another aspect, the surface of the sample can be treated by gas phase reactants before the foregoing discussed functionalized carboxylate deposition ("FCD"). This can be done by purging the chamber with the treatment gas before monolayer deposition.

In another aspect, the pressure within the chamber may be controlled. In some aspects the pressure may be controlled by an externally-mounted ball valve and pressure gauge connected to a vacuum pump via a hose.

In another aspect, the reactant may be re-collected. In some aspects the reactant may be re-collected using cold-trapping.

In another aspect, the chamber is evacuated with a gas. In some aspects the gas may be inert. In some aspects, the inert gas may be chosen from a group consisting of $N_2$, $CO_2$, and Ar.

As used herein, the term "halo" is meant to refer to F, Cl, Br and I.

As used herein, the term "alkyl" is meant to refer to a saturated hydrocarbon group which is straight-chained or branched.

As used herein, "cycloalkyl" refers to non-aromatic carbocycl groups and may include bi or polycyclic ring systems, as well as spiro ring systems.

As used herein, "heterocycl" refers to a saturated or unsaturated carbocycl group wherein one or more of the ring-forming carbon atoms of the carbocycl group are replaced by a heteroatom. In a further aspect, the heteroatom may be oxidized (e.g., have an oxo or sulfindo substituent). In a further aspect, where the heteroatom is N the N atom may be quaternized.

As used herein, the term "conjugated" is meant to refer to a coupled orbital system with delocalized electrons.

As used herein, "haloalkyl" refers to an alkyl group having one or more halogen substituents.

As used herein, the term "halocycloalkyl" refers to a cycloalkyl group having one or more halogen substituents.

As used herein, the term "haloheterocycl" refers to a heterocycl having one or more halogen substituents.

As used herein, the term "asymmetric carbon" refers to a carbon attached to four different substituents.

As used herein, the term "aryl" refers to an aromatic carbocycl group including monocyclic or polycyclic aromatic hydrocarbons.

As used herein, "heteroaryl" groups are aromatic heterocycl groups and include monocyclic and polycyclic aromatic hydrocarbons that have at least one heteroatom ring member.

As used herein, "uni-dentate" refers to a single bond formed between the oxygen of the hydroxyl group of the reactant of Formula 1 and the metal of the substrate as shown in Formula 2.

As used herein, "bi-dentate" refers to two (2) bonds between the reactant of Formula 1A and/or Formula 1B and the substrate. This includes, but is not limited to, the situation where a first bond is formed between the hydroxyl group of the reactant and the metal (M) of the inorganic substrate, and a second bond between the carbonyl oxygen of the reactant and a respective metal of the inorganic substrate. It also includes the situation where a first bond is formed between the hydroxyl group of the reactant and the metal (M) of the inorganic substrate, and without wishing to be bound to theory the second bond is believed to be a covalent bond formed between the α-carbon of the reactant and a metal of the metal-oxide substrate. It further includes the situation where a first bond is formed between the hydroxyl group of the reactant and the metal (M) of the inorganic substrate, and without wishing to be bound to theory the second bond is believed to be a covalent bond formed between the constituent group of the reactant and the metal of the inorganic substrate or a hydroxyl group on the surface of the inorganic substrate.

As used herein, "tri-dentate" refers to three (3) bonds between the reactant of Formula 1A and/or Formula 1B and the inorganic substrate. This includes, but is not limited to, the situation where a first bond is formed between the oxygen of the hydroxyl group of the reactant and the metal of the inorganic substrate, a second bond is formed between the α-carbon of the reactant and the metal of the inorganic substrate, and a third bond is formed between the oxygen of the carbonyl group of the reactant and the metal of the inorganic substrate. This also includes, but is not limited to, the situation where a first bond is formed between the oxygen of the hydroxyl group of the reactant and the metal of the inorganic substrate, a second bond is formed between the α-carbon of the reactant and the metal of the inorganic substrate, and a third bond is formed between the constituent group of the reactant and the metal of the inorganic substrate or a hydroxyl group on the surface of the inorganic substrate.

In certain aspects of the present invention, the hybrid materials are used to produce transformative chromatographic materials for advanced applications in separation science, such as stationary phases, including thin layer chromatography, high-performance and ultrahigh-performance liquid chromatography. Moreover aspects of the invention based on p-n type semiconductors are expected to find applications in single photon and photon on demand emitters. This opens the possibility of interesting and immediate application of the present invention in optoelectronics and separation science.

The present invention is transformative and holds significant promise to provide substantial advances in the scientific areas affected by the resulting materials produced as a direct result of this work.

EXAMPLES

Desired reactants of the present invention, such as those in Formula 1A and/or Formula 1B above, can be supplied or otherwise prepared by a number of common reactions, with the main synthetic route described in Formula 11 ($R^2$ in Formula 1 is inclusive of both $R^4$ in Formula 11 and the alkene or alkane carbon bonded directly to the alpha-carbon in Compounds 1 and 2 in Formula 11). In preparing the reactant as described in Formula 11, the aldehyde may be prepared through one of several known methods. Next, the resultant aldehyde is refluxed with a methyl acetate derivative in ethanol in the presence of piperidine, resulting in a methyl-ester intermediate. The methyl-ester intermediate is then refluxed with a 5% potassium hydroxide solution for a period of about two (2) hours. The reaction mixture is then diluted with water. The resulting solution may then be adjusted to a pH of about 5 to about 6.5 through the addition of 10% HCl at room temperature. A precipitate then typically forms. If a precipitate forms, it is then filtered and washed with an appropriate solvent (e.g., ethanol). The precipitate may then be purified by column chromatography using an appropriate mobile phase (e.g., a mixture of hexane and ethyl acetate). The purified product (Compound 1) may then be recrystallized in an appropriate solvent.

Compound 1 can also be synthesized directly by refluxing with cyanoacetic acid in chloroform in the presence of piperidine for a period of about 24 hours. The reaction mixture is then acidified with 10% HCl and extracted with chloroform. The organic layer is concentrated and crude compound is purified by column chromatography using an appropriate mobile phase (e.g., a mixture of hexane and ethyl acetate). The purified product (Compound 1) may then be recrystallized in an appropriate solvent.

To a solution of alkene (Compound 1) in methanol is added catalytic amount of 10% Pd/C and the mixture stirred under a hydrogen atmosphere for about 6 hours. After completion of reaction, the solution is filtered and the filtrate is concentrated. The crude product was purified on silica gel column using ethyl acetate/hexane. The purified product (Compound 2) may then be recrystallized in an appropriate solvent.

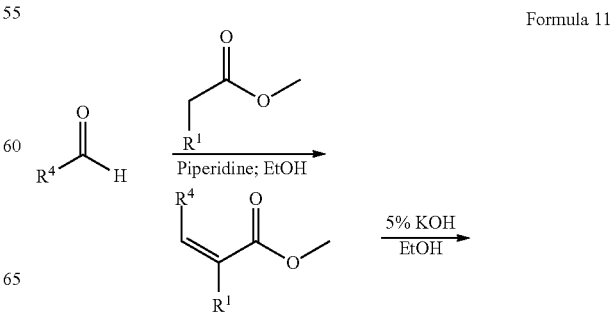

Formula 11

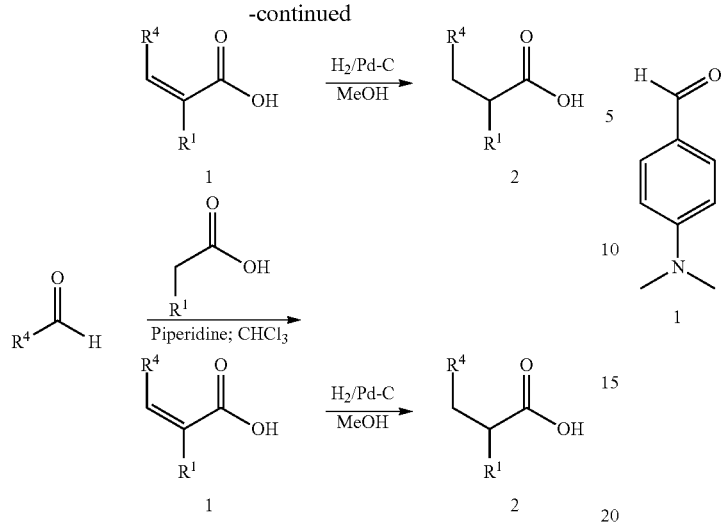

Example 1

Synthesis and Functionalized Carboxylate Deposition

Synthesis of M1 Dye

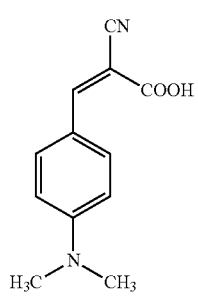

(Z)-2-cyano-3-(4-(dimethylamino)phenyl)acrylic acid (M1)

As illustrated in Scheme 1 below, 4-dimethylaminobenzaldehyde (1, 1.5 g, 10 mmol), methyl cyanoacetate (1.2 g, 12 mmol), and piperidine (0.1 g, 1.2 mmol) were dissolved in 20 mL ethanol and refluxed for 2 h to form the intermediate 2; methyl-(2Z)-2-cyano-3-[4-(dimethylamino)phenyl]prop-2-enoate, as a light yellow colored precipitate. The precipitate was collected via vacuum filtration and washed with ethanol. The crude precipitate was used for the next reaction without purification and characterization.

The intermediate 2 was then hydrolyzed in 5% KOH in ethanol (10 mL) by refluxing for 2 h. The reaction mixture was diluted by water and the solution pH was adjusted to 6 by adding 10% HCl at room temperature to form a yellow colored precipitate. The precipitate was then collected by vacuum filtration and washed with ethanol. The precipitate was then purified by column chromatography (with a 5:95 hexane/ethyl acetate mobile phase) and recrystallized from an ethanol solution to produce pure M1 as yellow powder (1.5 g, 69%).

Scheme 1.

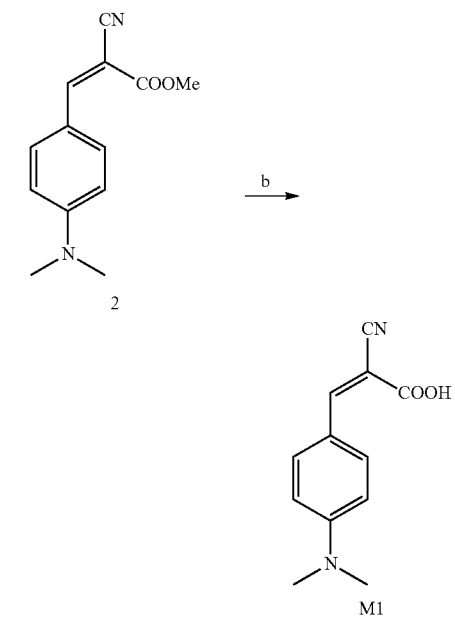

Reagents and conditions: (a) CNCH$_2$COOCH$_3$, piperidine, EtOH, reflux 2 h; (b) 5% KOH, EtOH, reflux 2 h, 69%.

Figure 3:
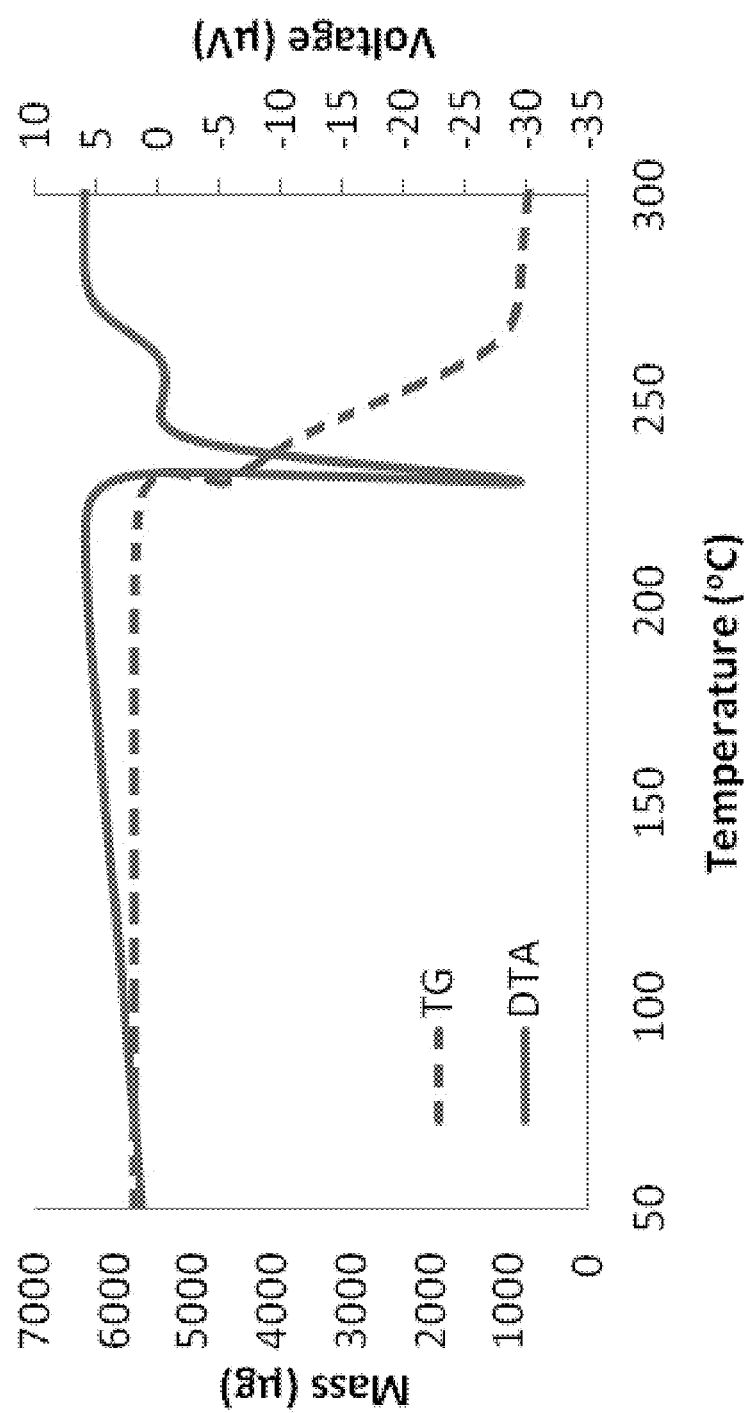
FIG. 3 is a graph illustrating the thermal gravimetry (TG) and differential thermal analysis (DTA) of Dye M1, which degraded at about 228° C.

M1 was then characterized using proton-nuclear magnetic resonance spectroscopy, whereby $^1$H-NMR (400 MHz, DMSO-d$_6$): δ 3.08 (s, 6H), 6.83 (d, J=9.1 Hz, 2H), 7.94 (d, J=9.1 Hz, 2H), 8.07 (s, 1H), 13.26 (brs, 1H). M1 decomposition was evaluated via thermogravimetry/differential thermal analysis (TG/DTA) providing a decomposition temperature of 228° C. as shown in FIG. 3.

TG analysis was also carried out with two N$_2$ flow rates (20 mL/min and 180 mL/min). Each flow rate produced identical behavior, which supports decomposition as the reason for the loss in mass as opposed to evaporation.

Synthesis of M2 Dye

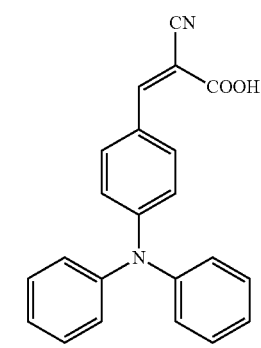

(Z)-2-cyano-3-(4-(diphenylamino)phenyl)acrylic acid (M2)

As illustrated in Scheme 2 below, 4-diphenylaminobenzaldehyde (1, 1.0 g, 3.66 mmol), methyl cyanoacetate (0.39 mL, 4.39 mmol), and piperidine (0.043 mL, 0.44 mmol) were dissolved in 20 mL of ethanol and refluxed for 2 h to form the intermediate 2; methyl-(2Z)-2-cyano-3-[4-(diphenylamino)phenyl]prop-2-enoate as a light orange precipitate. The precipitate was collected via vacuum filtration and washed with ethanol. The crude precipitate was used for next reaction without purification and characterization.

The intermediate 2 was then hydrolyzed in 5% KOH in ethanol (10 mL) by refluxing for 2 h. The reaction mixture was diluted by water and the solution pH was adjusted to 6 by adding 10% HCl at room temperature to form an orange colored precipitate. The precipitate was then collected by vacuum filtration and washed with ethanol. The precipitate was then purified by column chromatography (with a 10:90 hexane/ethyl acetate mobile phase) and recrystallized from an ethanol solution to produced pure M2 as an orange powder (0.7 g, 60%).

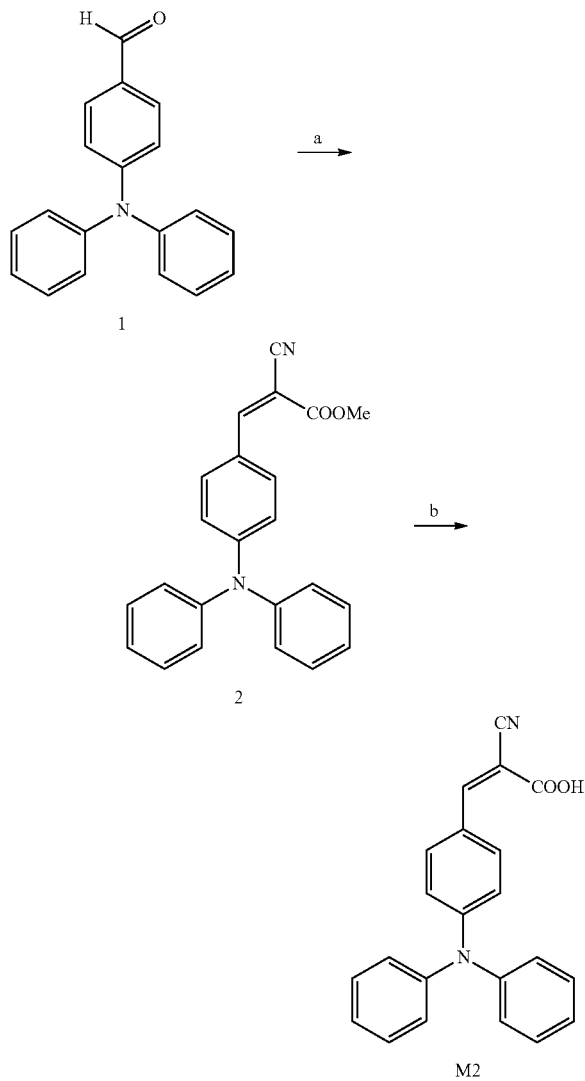

Scheme 2.

Reagents and conditions: (a) CNCH$_2$COOCH$_3$, piperidine, EtOH, reflux 2 h; (b) 5% KOH, EtOH, reflux 2 h, 60%.

Figure 4:
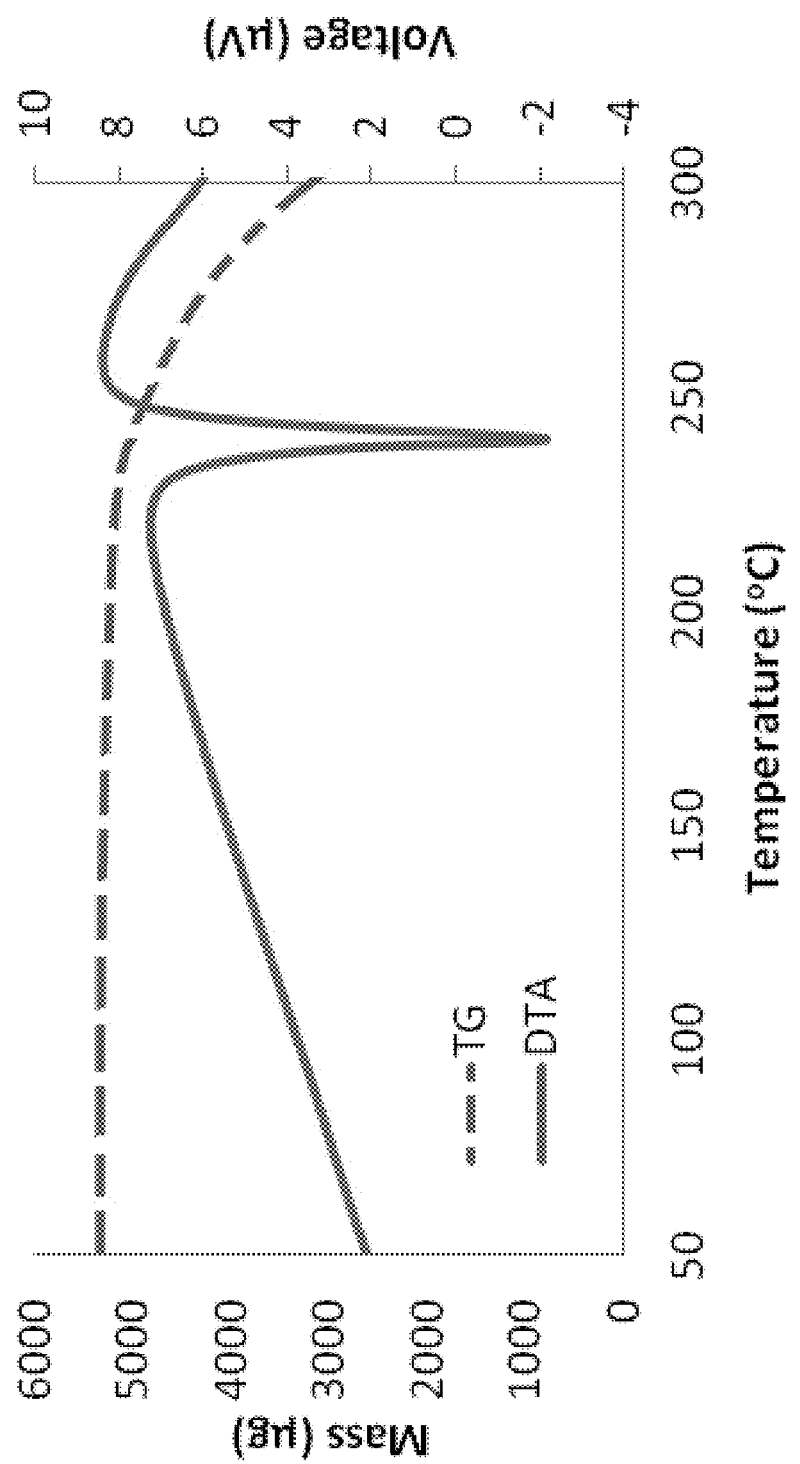
FIG. 4 is a graph illustrating the thermal gravimetry (TG) and differential thermal analysis (DTA) of Dye M2, which degraded at about 240° C.

M2 was then characterized using proton-nuclear magnetic resonance spectroscopy, whereby $^1$H-NMR (400 MHz, DMSO-d$_6$): δ 6.87 (d, J=9 Hz 2H), 7.19 7.29 (m, 6H), 7.43 (t, J=9 Hz, 4H), 7.92 (d, J=9 Hz, 2H), 8.14 (s, 2H), 13.64 (brs, 1H). M2 decomposition was evaluated via thermogravimetry/differential thermal analysis (TG/DTA) providing a decomposition temperature of 240° C. as shown in FIG. 4. TG analysis was also carried out with two N$_2$ flow rates (20 mL/min and 180 mL/min). Each flow rate produced identical behavior, which supports decomposition as the reason for the loss in mass as opposed to evaporation.

Deposition of Functionalized Carboxylic Acid Derivatives

Figure 5:
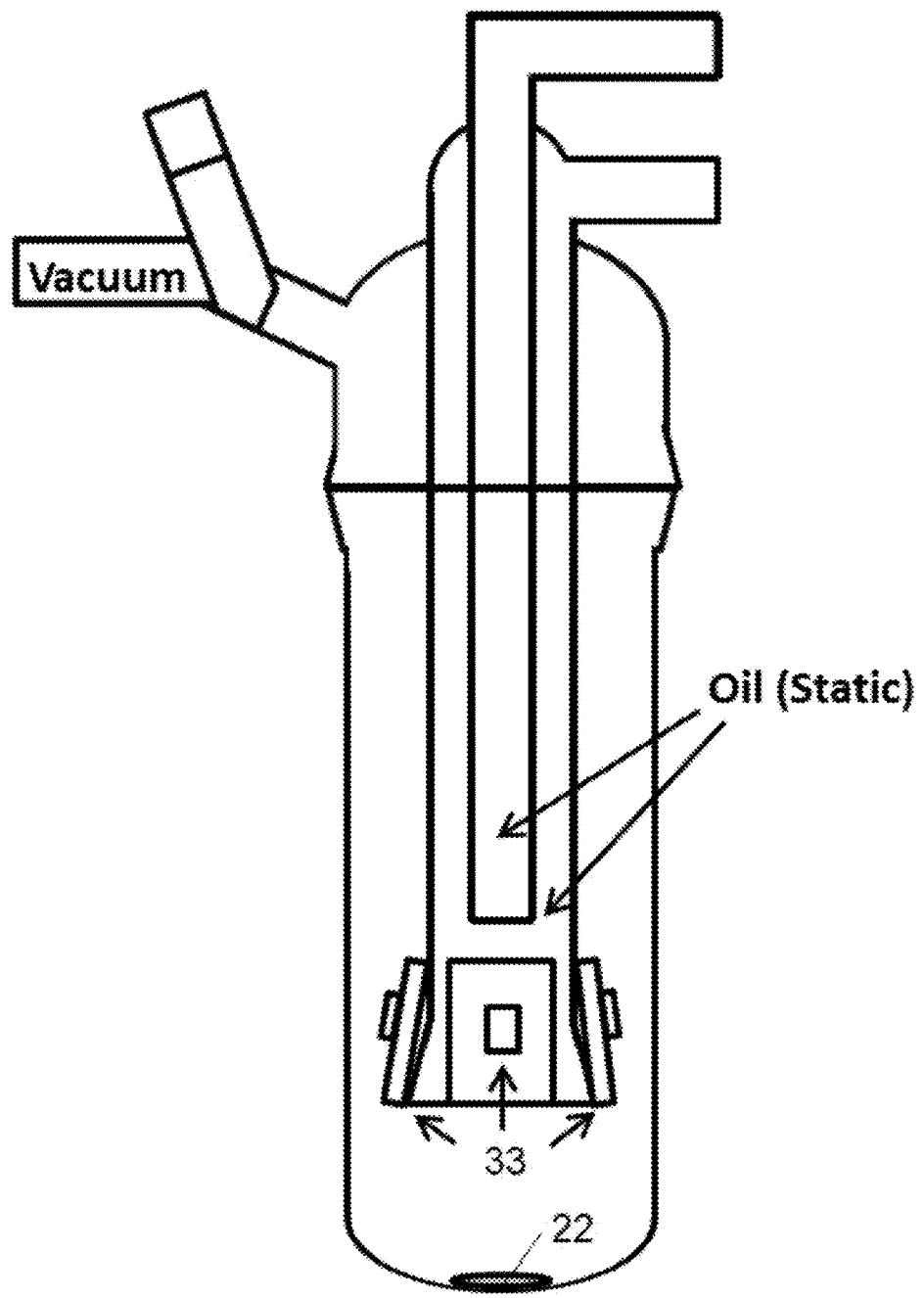
FIG. 5 is a schematic of an apparatus used for FCD of dye sensitizers according to certain methods of the present invention, the top glass piece containing a vacuum needle valve and housing a condenser (cold finger) filled with oil where the photoelectrodes are fixed, the lower glass piece containing the reactant, and the top and bottom pieces connected via an o-ring joint and held together with a pinch clamp.
Figure 6:
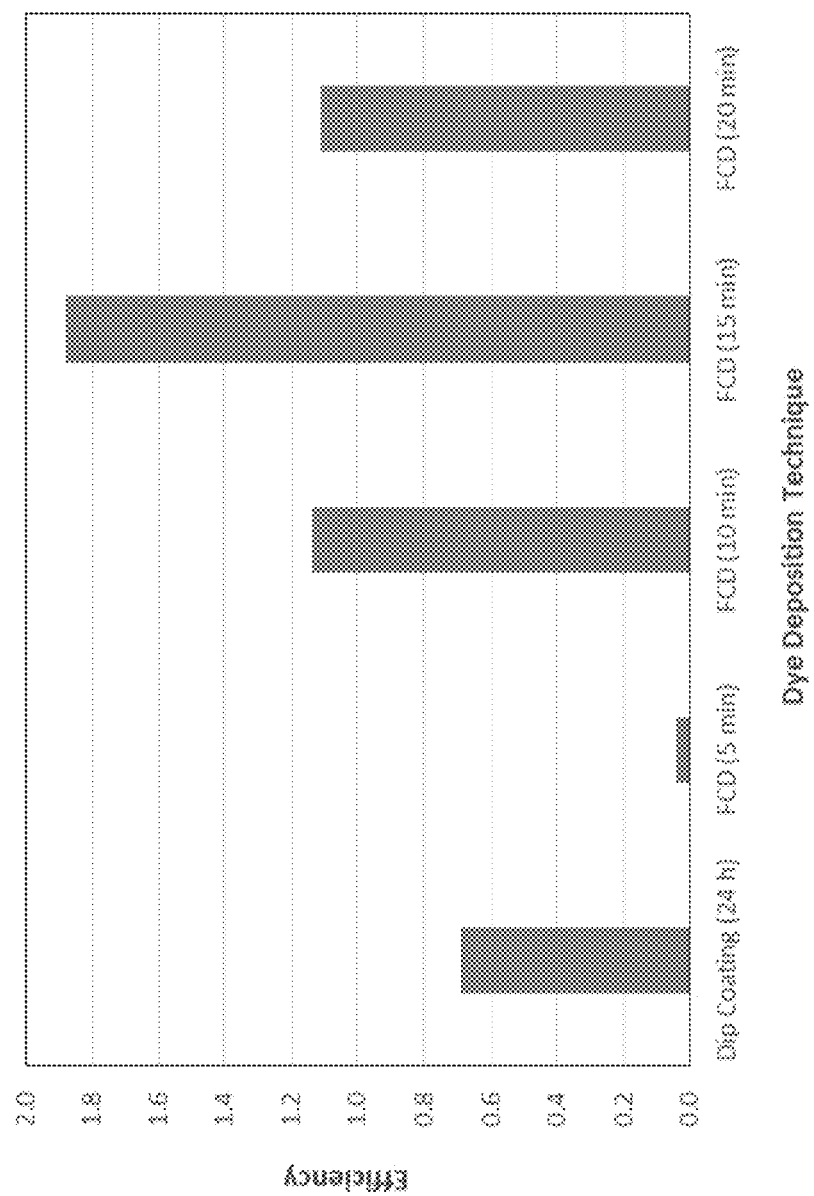
FIG. 6 is a graph illustrating the efficiencies of dye-sensitized solar cells manufactured using dip-coating of the prior art, which is solution-based and a 24 hr, process, as compared to the functionalized carboxylate deposition process, which is gas-based and a process of less than about 20 minutes, of the present invention.

Functionalized carboxylate deposition (FCD) of the present invention was accomplished using a glass sublimation apparatus of FIG. 5, the sublimation apparatus comprising a grease-free two-piece glass vessel where the top piece contained a condenser (cold finger) filled with oil and vacuum needle valve and the lower piece was used to hold the deposition reactant material 22, as depicted in FIG. 5. The substrate 33 comprised TiO$_2$ electrodes, which were fixed to the cold finger with 3-5 mg of solid dye as the reactant 22 placed in the bottom of the apparatus. The top and bottom were connected via an o-ring joint and held together by a pinch clamp. A vacuum (~181 Torr) was applied using a high vacuum pump for approximately 1 minute. The temperature was gradually increased up to 180° C. for M1 and 210° C. for M2, where the initial sublimation of the solid dye reactant 22 occurred.

To determine the optimal dye deposition time, M1 was deposited onto TiO$_2$ electrodes for 5, 10, 15 and 20 minutes according to the procedure outlined above and compared with dye deposition via dip-coating. The dyed TiO$_2$ electrodes were then used to fabricate DSCs. The standard J-V performance of the solar cells was tested and the results of which are shown in Table 1. The dependence of efficiency based on the deposition technique and duration of deposition is reported in FIG. 7.

TABLE 1

Standard J-V solar cell performance when depositing M1 dye via dip-coating and FCD (at various deposition times).

| Deposition mode | Time | J$_{sc}$ (mA/cm$^2$) | V$_{oc}$ (mV) | FF (%) | Efficiency (%) |
|---|---|---|---|---|---|
| Dip-Coating | 24 h | 2.35 | 586.3 | 50.22 | 0.69 |
| FCD | 5 min | 0.16 | 469.5 | 64.05 | 0.04 |
| FCD | 10 min | 3.29 | 601 | 56.07 | 1.42 |
| FCD | 15 min | 5.46 | 597 | 57.95 | 1.88 |
| FCD | 20 min | 3.24 | 555 | 61.1 | 1.11 |

The efficiency of the DSCs increased with increasing deposition times from 5 min to 15 min, where the efficiency was maximized. After this time, the efficiency decreased significantly, possibly due to dye aggregation, leading to inefficient electron transfer from aggregated dyes to the photoelectrode. FCD processed DSCs at 15 minutes of deposition, produced approximately three times the efficiency of the state-of-the-art dip-coating dye deposition. Using the optimal dye deposition time, the M1 and M2 dyes were sublimated for about 15 minutes, during which time deposition of the respective dye onto the TiO$_2$ electrodes occurred. The electrodes were then washed with acetone and used to fabricate solar cells. The current dip-coating technique for dye deposition was also used for comparison.

Figures 7A, 7B:
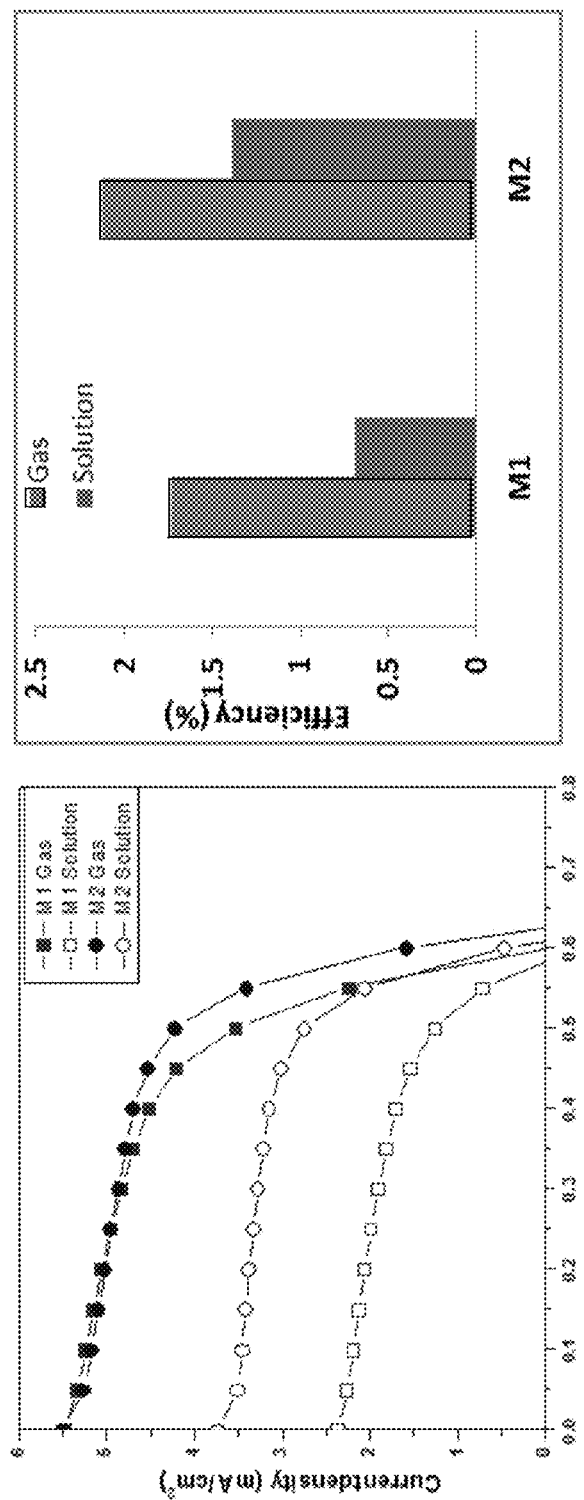
FIG. 7A is a graph comparing the J-V behavior of dyes M1 and M2 deposited onto $TiO_2$ electrodes using the dip-coating in a solution (24 h) of the prior art and functionalized carboxylate deposition process (15 min) according to certain aspects of the present invention.
FIG. 7B is a graph comparing the efficiencies of dyes M1 and M2 deposited onto $TiO_2$ electrodes using the dip-coating in a solution (24 h) of the prior art and functionalized carboxylate deposition process (15 min) according to certain aspects of the present invention.

M1 and M2 dyes were deposited on TiO$_2$ electrodes using solution (24 h) and gas phase (15 min) processing. DSCs were fabricated from the dyed electrodes and the results are shown in FIGS. 7A and 7B and Table 2.

TABLE 2

Standard J-V solar cell performance when depositing M1 and M2 dye via dip-coating (24 hrs) and FCD (15 min).

| Dye | Deposition mode | $J_{sc}$ (mA/cm$^2$) | $V_{oc}$ (mV) | FF (%) | Efficiency (%) |
|---|---|---|---|---|---|
| M1 | FCD | 4.77 | 598 | 61.07 | 1.73 |
| M1 | Dip-coating | 2.35 | 586 | 50.22 | 0.69 |
| M2 | FCD | 5.50 | 626 | 61.66 | 2.12 |
| M2 | Dip-coating | 3.72 | 606 | 62.28 | 1.38 |

DSCs fabricated using the gas phase deposition process (at the optimized 15 minute time) showed 3 and 1.5 times more efficiency for the M1 and M2 dyes, respectively, when compared to the 24 hour solution-based dip-coating process.

Functionalized Carboxylate Deposition Time

FCD of the present invention is a gas-phase deposition technique, which is used to rapidly deposit activated organic molecules on inorganic oxide materials, including very highly porous oxides (e.g., nanoporous TiO$_2$). In this example, FCD was accomplished using the grease-free two-piece glass sublimation apparatus of FIG. 5. M1 and M2 dyes in a solid form were placed in the bottom piece of the apparatus and TiO$_2$ photo-electrodes were affixed to the bottom of the condenser. The two pieces of the sublimation apparatus were secured together with a pinch clamp and a vacuum (~181 Torr) was applied. The sublimation apparatus was subsequently immersed in a pre-heated oil bath (30-40° C. below the decomposition temperature of the dye being deposited). The dyes were allowed to sublimate/evaporate and deposit on three TiO$_2$ photoelectrodes for each of the periods of time of: 5 minutes, 10 minutes, 15 minutes, 20 minutes, 30 minutes, 45 minutes and 60 minutes, with the efficiency of the resulting three DSCs at each period of time evaluated and averaged.

Figure 11:
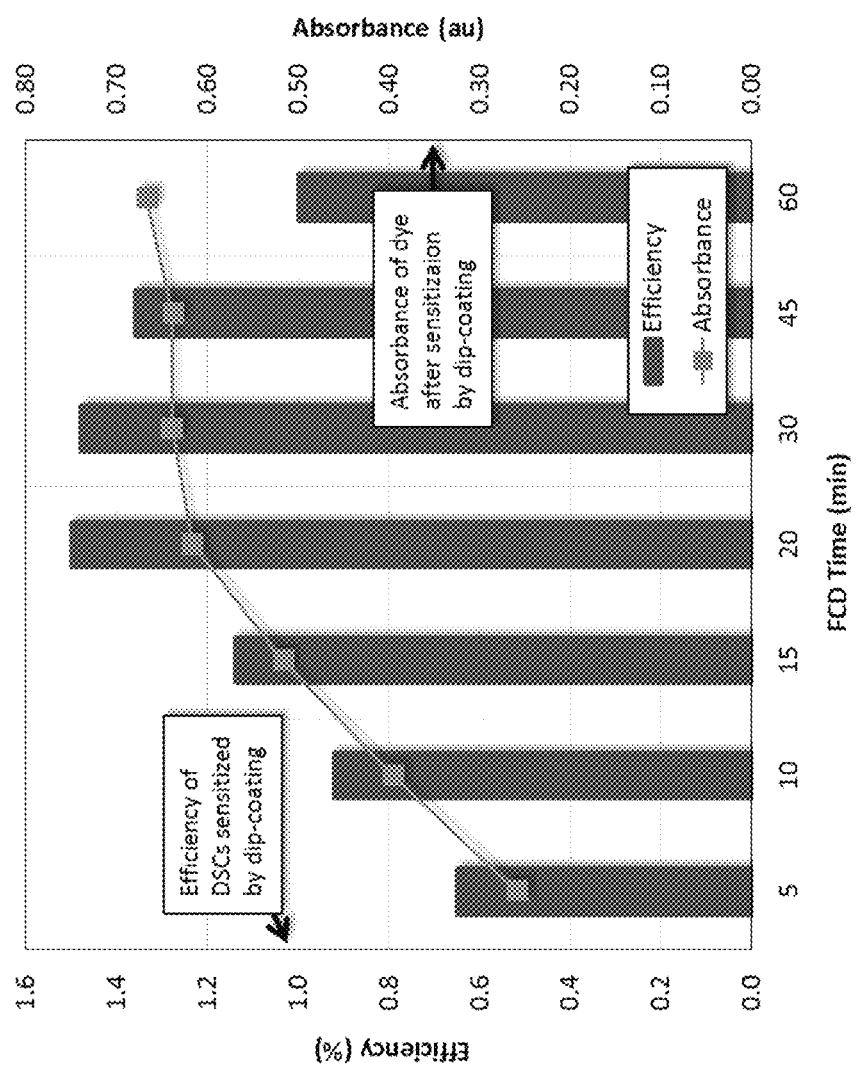
FIG. 11 is a graph depicting the efficiencies of DSCs sensitized with dye M1 by dip-coating (24 hours) and the FCD process of the present invention for periods of time between 5 minutes and 60 minutes, and the absorbance of the dyes desorbed from the photoelectrode surface for the dip-coating (24 hours) and various periods of time for the FCD process according to certain aspects of the present invention.
Figure 12:
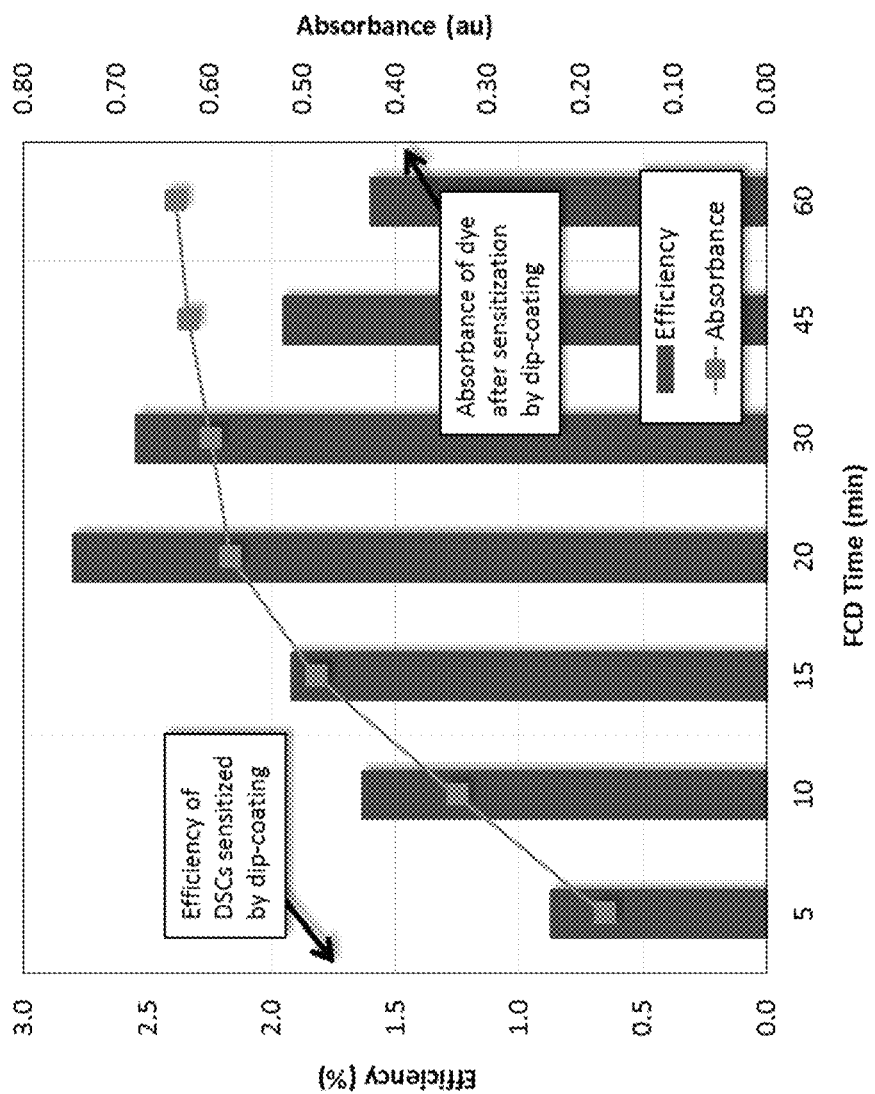
FIG. 12 is a graph depicting the efficiencies of DSCs sensitized with dye M2 by dip-coating (24 hours) and the FCD process of the present invention for periods of time between 5 minutes and 60 minutes, and the absorbance of the dyes desorbed from the photoelectrode surface for the dip-coating (24 hours) and various periods of time for the FCD process according to certain aspects of the present invention.

FIG. 11 shows the change in the average DSC efficiency as the FCD time was varied for dye M1. FIG. 12 shows the change in average DSC efficiency as the FCD time was varied for dye M2. After the efficiency was measured, the DSCs were deconstructed and the respective dye bound to the photoelectrode was desorbed by soaking in 0.1 M KOH. The maximum absorbance of the desorbed dye is also plotted in FIG. 11 for M1 and FIG. 12 for M2. For comparison, DSCs were also fabricated by sensitization via dip-coating. The average efficiencies of the resulting DSCs and absorbance of the desorbed dyes are indicated in FIGS. 11 and 12. Detailed performance and spectrophotometric data are provided in Table 3 and FIG. 13.

TABLE 3

Standard J-V data of dip-coated and FCD sensitized DSCs with M1 and M2. The deposition time was varied to determine the optimum FCD duration with 20 minutes as optimum for both dyes.

| Dye | Deposition mode | Time (min) | $J_{sc}$ (mA/cm$^2$) | $V_{oc}$ (mV) | Fill Factor | Efficiency (%) | Absorbance (AU) |
|---|---|---|---|---|---|---|---|
| M1 | FCD | 5 | 1.91 | 555 | 0.62 | 0.65 | 0.259 |
|  | FCD | 10 | 2.66 | 537 | 0.64 | 0.92 | 0.396 |
|  | FCD | 15 | 3.10 | 535 | 0.68 | 1.14 | 0.517 |
|  | FCD | 20 | 3.42 | 617 | 0.71 | 1.50 | 0.617 |
|  | FCD | 30 | 3.82 | 587 | 0.67 | 1.48 | 0.640 |
|  | FCD | 45 | 3.17 | 620 | 0.69 | 1.36 | 0.639 |
|  | FCD | 60 | 2.80 | 559 | 0.66 | 1.00 | 0.667 |
|  | Dip-coating | 24 hr | 2.85 | 550 | 0.67 | 1.05 | 0.356 |
| M2 | FCD | 5 | 2.22 | 579 | 0.67 | 0.87 | 0.175 |
|  | FCD | 10 | 3.91 | 609 | 0.68 | 1.63 | 0.334 |
|  | FCD | 15 | 4.42 | 607 | 0.71 | 1.92 | 0.486 |
|  | FCD | 20 | 6.44 | 673 | 0.64 | 2.80 | 0.578 |
|  | FCD | 30 | 5.97 | 655 | 0.65 | 2.55 | 0.599 |
|  | FCD | 45 | 4.72 | 609 | 0.68 | 1.95 | 0.623 |
|  | FCD | 60 | 4.16 | 610 | 0.69 | 1.77 | 0.636 |
|  | Dip-coating | 24 hr | 4.16 | 615 | 0.69 | 1.76 | 0.398 |

As shown in FIGS. 11 and 12, the efficiency of the FCD-sensitized DSCs and the surface coverage increased up to 20 minutes for M1 (FIG. 11) and M2 (FIG. 12). After 20 minutes, the efficiency then decreased while the surface coverage indicated by the absorbance only slightly increased. The decrease in efficiency is more pronounced for M2 in FIG. 12 than M1 in FIG. 11. The increased efficiency over the first 20 minutes is predominately attributed to increased dye loading resulting in an increase in the $J_{sc}$, as shown in the data of Table 3 and shown in FIGS. 11 and 12. This conclusion is supported by the dye surface coverage (small squares in FIGS. 11 and 12 representing absorbance) increasing at essentially the same rate as the efficiency (bars), as seen by the similar slopes of these two parameters. Also, it is known that the surface coverage of dye molecules M1 and M2 directly bonded to the TiO$_2$ photoelectrode surface has a direct impact on the $J_{sc}$ of the resulting DSC. The maximum efficiency and surface coverage of FCD-sensitized DSCs (at 20 min) were greater than 1.5 times the dip-coating DSCs.

The rate of change of surface coverage with increasing FCD times shows a marked difference between the first 20 minutes and longer deposition times. This indicates that FCD sensitization of M1 and M2 are self-limiting, at least to some extent. Although the surface coverage is self-limiting, the DSC efficiency at FCD times greater than 20 minutes drops rapidly for M2 and more slowly for M1. The decrease in efficiency after 20 min, with simultaneous slight increases in dye loading illustrated in FIGS. 11 and 12, is likely due to dye aggregation leading to inefficient electron transfer. Aggregation leads to non-surface bound sensitizer molecules, resulting in photon capture without injection of the excited electron into the TiO$_2$ semiconductor. This excited electron either relaxes to the ground state or is transferred to the electrolyte where it acts to combine with vacant orbitals, decreasing productive electron flow and lowering the efficiency of the DSCs. A high energy electron from an excited dye molecule may also participate in the generation of reactive species that may degrade surface-bound dye molecules. FIGS. 11 and 12 indicate that the sensitization of DSCs may be delicate, with both undersensitization or underloading with the reactant and oversensitization or overloading with the reactant leading to a loss in efficiency.

As such, the optimal period of time of depositing the reactant on the substrate using the FCD process (correlating to the highest efficiency of the fabricated DSC) is related to the rate of surface coverage, with the optimal period of time corresponding to the breakpoint in the absorbance slope of the reactant deposited onto the substrate relative to the depositing time. For instance, the optimal period of time of the FCD process for M1 is about 20 minutes as shown in FIG. 11, as the absorbance breakpoint for M1 occurs at about 20 minutes of depositing, while the optimal period of time of the FCD process for M2 is about 18 minutes as shown in FIG. 12, as the absorbance breakpoint for M2 occurs at about 18 minutes of depositing.

In some aspects, it is contemplated that the optimal period of time of depositing the reactant in a gas-phase on the substrate using the FCD process of the present invention is less than about 45 minutes, in some aspects less than about 40 minutes, in some aspects less than about 35 minutes, in some aspects less than about 30 minutes, in some aspects less than about 25 minutes, in some aspects less than about 20 minutes, and in some aspects less than about 15, minutes.

In some aspects, it is contemplated that optimal period of time of depositing the reactant in a gas-phase on the substrate using the FCD process of the present invention is between about 10 minutes and about 45 minutes, in some aspects between about 15 minutes and about 40 minutes, and in some aspects between about 18 minutes and about 35 minutes, and in some aspects between about 20 minutes and about 30 minutes.

Dye Sensitization by FCD and Dip-Coating

Figure 13A:
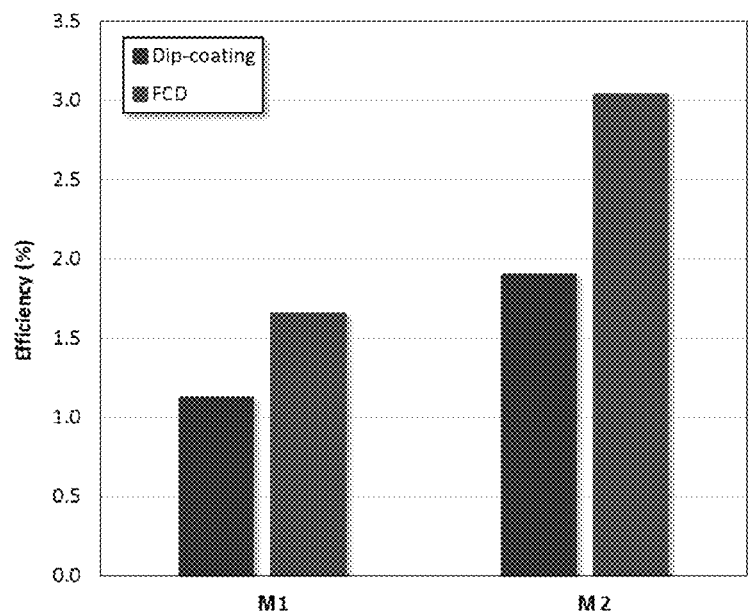
FIG. 13A is a graphical comparison of the efficiencies of DSCs sensitized with M1 and M2.
Figure 13B:
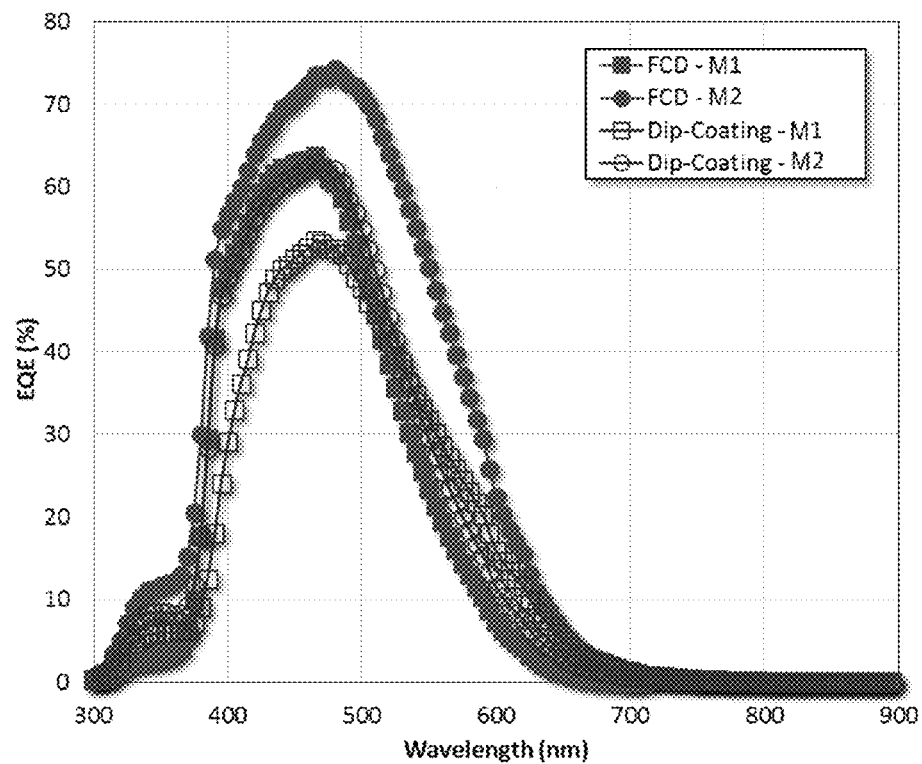
FIG. 13B is a graphical comparison of the external quantum efficiency (EQE) of the DSCs, the efficiency of FCD-sensitized DSCs is greater than or equal to about 1.5 times the efficiency of dip-coated DSCs, with he efficiency increase being relatively consistent throughout the EQE.

DSCs were fabricated from $TiO_2$ electrodes dyed with M1 and M2 by dip-coating (24 h) and FCD (20 min). The cell performance is illustrated in FIG. 13A, which shows a comparison of efficiencies between the dip-coating and FCD processes for M1 and M2, and FIG. 13B, which shows a comparison of the external quantum efficiency (EQE) of the cells. Table 3 provides the detailed performance data of the $TiO_2$ electrodes dyed with M1 and M2 by dip-coating (24 h) and FCD (20 min).

TABLE 3

Standard characterization metrics for DSCs produced using FCD (20 min) and dip-coating (24 h). FCD easily outperformed dip-coating at a fraction of the time.

| Deposition mode | Dye | $J_{sc}$ (mA/cm$^2$) | $V_{oc}$ (mV) | Fill Factor | $R_s$ | $R_{sh}$ | Efficiency (%) |
|---|---|---|---|---|---|---|---|
| FCD | M1 | 4.57 | 575 | 0.63 | 21.9 | 833 | 1.65 |
| FCD | M2 | 7.80 | 661 | 0.59 | 19.2 | 588 | 3.03 |
| Dip-coating | M1 | 3.38 | 553 | 0.60 | 31.1 | 714 | 1.12 |
| Dip-coating | M2 | 5.34 | 603 | 0.59 | 23.9 | 588 | 1.90 |

DSCs fabricated using FCD (at the optimized deposition time) were 1.5 and 1.6 times, or 47% and 57%, more efficient for M1 and M2, respectively, when compared to DSCs fabricated using dip-coating. Moreover, the efficiency of M2 FCD-sensitized DSC was 91% of the publicly known produced by dip-coating (η=3.3%, $V_{oc}$=770 mV, fill factor=0.67), even though both the fill factor and the $V_{oc}$ were lower for FCD-sensitized cells. As with the initial comparison of FCD to dip-coating (FIGS. 11 and 12), the increased efficiency of FCD compared to dip-coating was attributed mainly to increased dye loading, which was evident both visually and by the increase in $J_{sc}$ of approximately 1.4 times for each dye. The EQE behavior of the DSCs produced also supports increased dye loading using FCD as the most significant reason for the improved efficiency, with the only consistent difference between the processes being a relatively consistent (~10%) increase in EQE for FCD-sensitized DSCs (i.e., the shapes of the M1 EQE curves were different in certain portions of the solar spectrum for the two dye loading processes, but these difference did not consistently translate to M2). The EQE curves for the dyes have similar shapes to their absorbance spectra, although red-shifted slightly, which is common for DSC dyes bound to $TiO_2$.

The range of $V_{oc}$s for the DSCs, 553-661 mV, was fairly narrow, although FCD dye sensitization produced higher $V_{oc}$s for both dyes. The increase in the $V_{oc}$ was likely caused by an increase in the Fermi level of $TiO_2$ due to higher dye loading and saturation of trap states within the photoelectrode. The fill factor for the DSCs was very consistent 0.59-0.63, indicating the quality of the DSCs were similar for each dye and each sensitization method. To compare the cells made in this study to a standard dye molecule, DSCs were concurrently created under the same conditions with the Ru-based sensitizer, N719, by dip-coating. The overall efficiency of the N719-based DSCs was 5.3%. The $V_{oc}$ (665 mV) and fill factor (0.58) of the N719-based DSC were very similar to the M2 FCD-sensitized DSCs, with increased $J_{sc}$ for N719 accounting for the majority of the efficiency difference between these two cells. The increased $J_{sc}$ was attributed to the ability of N719 to absorb a wider range of the solar spectrum than M1 and M2.

Dye utilization—Gas-Phase of FCD Process v. Solution-Based

Because the highest efficiency DSC dyes are costly, recovery and/or limited use of these expensive dyes is essential for cost-effective production of DSCs. In addition to rapid dye sensitization, FCD of the present invention offers the potential to afford efficient dye use as a significant material cost advantage. DSC sensitization may ultimately require quantities of the reactant in the microgram range for DSCs production. For example, using a standard DSC photoelectrode with a surface roughness of 1000 and a grafting density of around one dye molecule per 2 nm$^2$ surface area, 18 μg/cm$^2$ of M1 would be necessary to cover the entire photoelectrode surface. Currently, highly concentrated dye solutions (0.2-0.5 mM) are used for dip-coating. For comparison, considering the relatively low molecular weight of M1, 0.8-2.2 mg is necessary to produce a 20 mL solution for dip-coating. Assuming 100 slides can be dyed from the same solution, 147 μg/cm$^2$ of dye is utilized, almost 10 times more than is needed for FCD. Accordingly, the FCD process of the present invention not only reduces dye-sensitized solar cell dye loading time by about 98% and increase the efficiencies by greater than 1.5 times, but the FCD process of the present invention reduces the amount of reactant material during the fabrication process.

In some aspects, it is contemplated that the quantity of reactant material for the FCD process on an inorganic oxide substrate is less than about 100 μg/cm$^2$, in some aspects less than about 50 μg/cm$^2$, in some aspects less than about 25 μg/cm$^2$, and in some aspects less than about 20 μg/cm$^2$, and in some about 15 μg/cm$^2$. In some aspects, it is contemplated that the quantity of reactant for the FCD process on an inorganic oxide substrate is between about 10 μg/cm$^2$ and about 100 μg/cm$^2$, in some aspects between about 12 μg/cm$^2$ and about 50 µg/cm$^2$, in some aspects between about 14 µg/cm$^2$ and about 25 µg/cm$^2$, and in some aspects between about 15 µg/cm$^2$ and about 20 µg/cm$^2$.

Surface Characterization: Bonding and Film Growth

Kelvin Probe Force Microscopy (KPFM) was used to evaluate the surface coverage and growth mechanism of FCD using M1 by mapping the surface potential of FCD-modified TiO$_2$. Because KPFM requires a relatively smooth surface, a compact layer of TiO$_2$ was used as the substrate instead of DSC photoelectrodes. Also, the amount of dye available for deposition was strictly controlled by creating a dilute solution of M1 in methanol (20 mg/L), adding a specific volume of this solution to the sublimation apparatus (0.3-30 mL), and allowing the solvent to evaporate prior to the FCD process.

Figure 14:
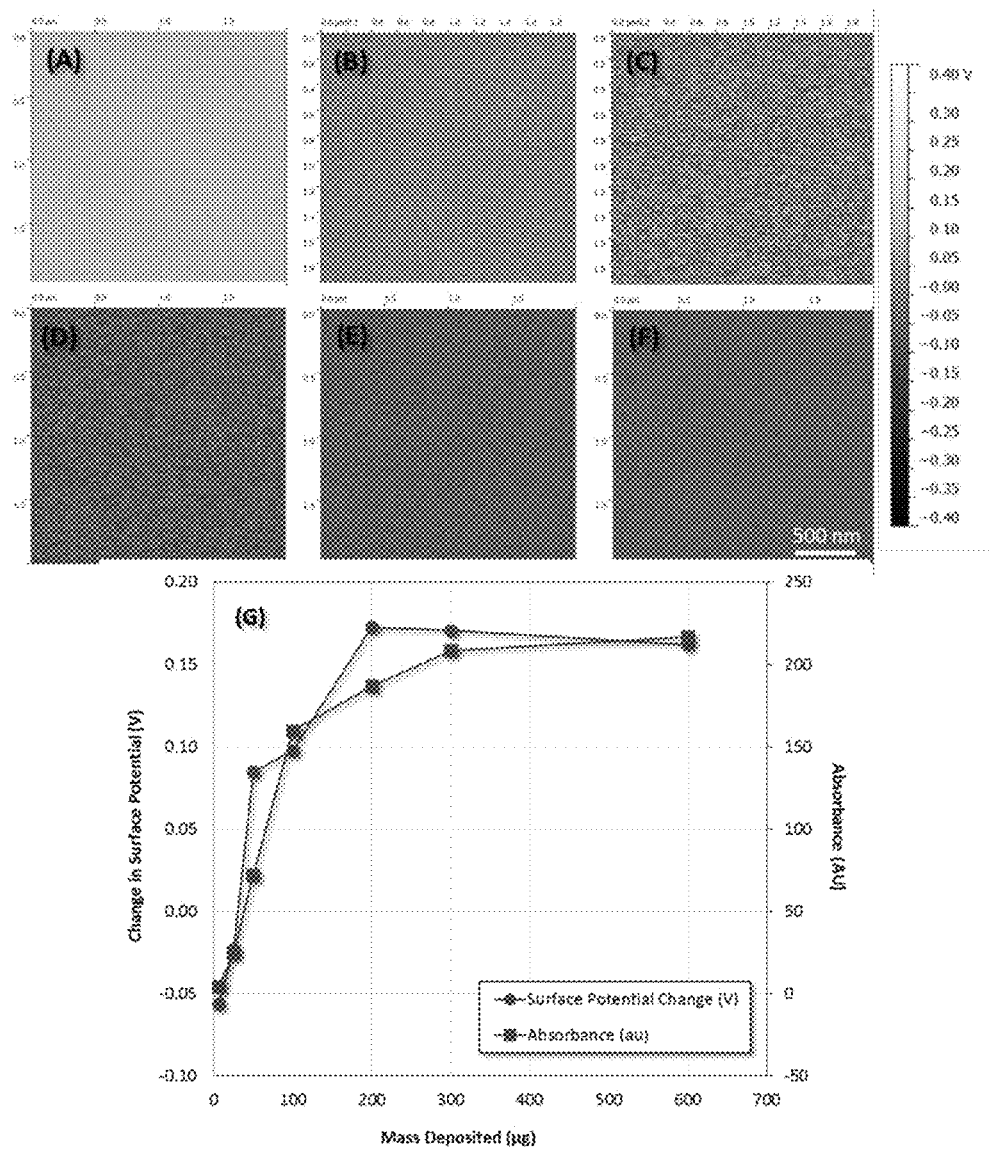
FIG. 14 illustrates Kelvin Probe Force Microscopy images of FCD-sensitized (M1) $TiO_2$ compact layers, the amount of M1 available for deposition being 25 mg in image (A), 50 mg in image (B), 100 mg in image (C), 200 mg in image (D), 300 mg in image (E), and 600 mg in (F) mg, and in graph (G) the absorbance behavior and surface potential change (plotted as the absolute change from the surface potential of non-sensitized compact $TiO_2$) of the deposition amounts (A)-(F), which are essentially identical and both indicative of self-limiting behavior for the FCD process of the present invention.

FIG. 14 shows the surface potential maps of the M1 sensitized TiO$_2$ compact layers (A-F) and the change in the average surface potential with increasing surface coverage of the dye (G; plotted as a change from non-sensitized compact layer TiO$_2$). The surface potential maps show the gradual non-localized decrease in surface potential. This behavior suggests that there are a high number of nucleation sites on the TiO$_2$ surface for the adsorption of the dye and that island formation (i.e., aggregation) is not the main growth mechanism for dye sensitization. The potential maps also show a very uniform appearance when depositing greater than 200 µg of M1 (E) and (F) in FIG. 14. This indicates a self-limiting process and uniform surface coverage under these conditions. The self-limiting nature of FCD deposition of M1 is also confirmed by the behavior of surface coverage (as measured by absorbance of the dye desorbed from the compact layers) and average surface potential as a function of the amount of dye deposited (G) in FIG. 14. Both surface coverage and change in surface potential approach a maximum, with very similar relative behavior. The large change in surface potential over the course of the amounts deposited (approximately 220 mV), along with the uniform appearance of the surface coverage maps at large surface coverage, indicates that excellent surface coverage is achieved by FCD.

Surface Bonding Mode

FTIR analysis can be used to elucidate the binding mode of carboxylates on oxide surfaces using the Deacon-Philips rule, which states: if the frequency separation of the asymmetric ($v_{as} \approx$ 1600 to 1670 cm$^{-1}$) and symmetric ($v_s \approx$ 1350 to 1390 cm$^{-1}$) stretch of the sodium carboxylate ($\Delta v = v_{as}(COO^-) - v_s(COO^-)$) is less than the $\Delta v$ of the TiO$_2$-bound dye, the surface bonding mode is uni-dentate, otherwise it is bi-dentate (i.e., bi-dentate bridging or bi-dentate chelating).

TABLE 4

The carboxylate stretches used to determine the binding mode of M1 and M2. The binding mode was determined according to the Deacon-Philips rule.

| Dye | Deposition Mode | $v_{as}$ (cm$^{-1}$) | $v_s$ (cm$^{-1}$) | Difference (cm$^{-1}$) | Binding Mode |
|---|---|---|---|---|---|
| M1 | Sodium Salt | 1605 | 1365 | 240 | NA |
|  | FCD | 1633 | 1385 | 248 | Unidentate[a] |
|  | Dip-coating | 1631 | 1384 | 247 | Unidentate[a] |
| M2 | Sodium Salt | 1586 | 1364 | 222 | NA |
|  | FCD | 1588 | 1382 | 193 | Bidentate[a] |
|  | Dip-coating | 1585 | 1392 | 206 | Bidentate[a] |

[a]If the frequency separation of the asymmetric ($v_{as}$) and symmetric ($v_s$) stretch of the sodium carboxylate is less than the $\Delta v$ of the TiO$_2$-bound dye, the surface bonding mode is uni-dentate, otherwise it is bi-dentate (i.e., bridging or chelating).

Figure 15:
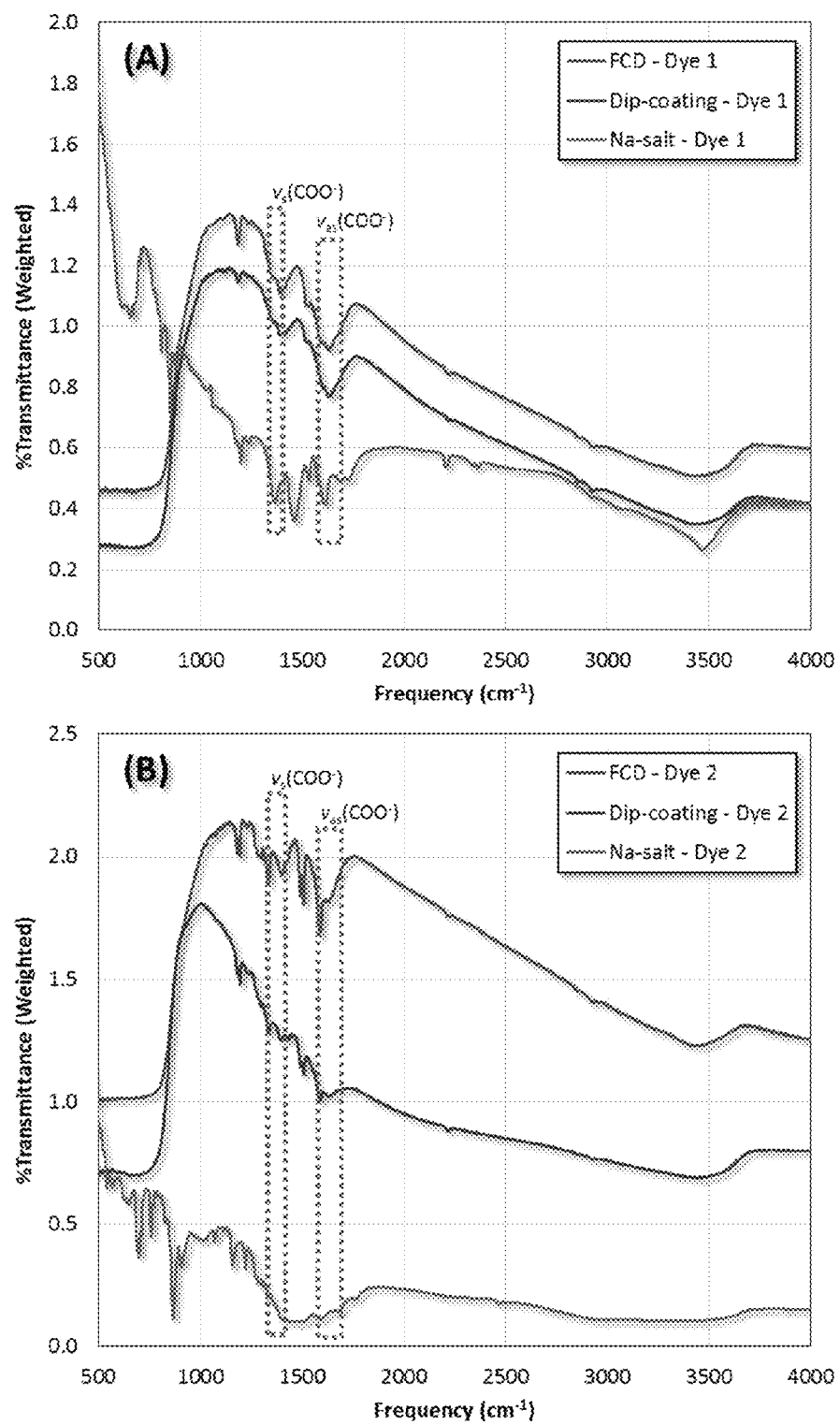
FIG. 15 is FT-IR spectra of M1 (A) and M2 (B), both as sodium salts, bonded to $TiO_2$ via FCD sensitization of the present invention, and bonded to $TiO_2$ via dip-coating.

Inspection of the FTIR data in FIG. 15 and Table 4 indicates that the binding mode of M1 on TiO$_2$ using FCD and dip-coating for sensitization is unidentate, whereas the binding mode for M2 is bidentate (dip-coating or FCD). For each individual dye, the FTIR spectra shown in FIG. 15 for FCD and dip-coating are virtually indistinguishable, indicating that the bonding of the dyes is essentially the same, regardless of the deposition technique. This result further corroborates that dye loading is likely responsible for the increased efficiency and not differences in bonding produced by differences in the two sensitization techniques.

Figure 16:
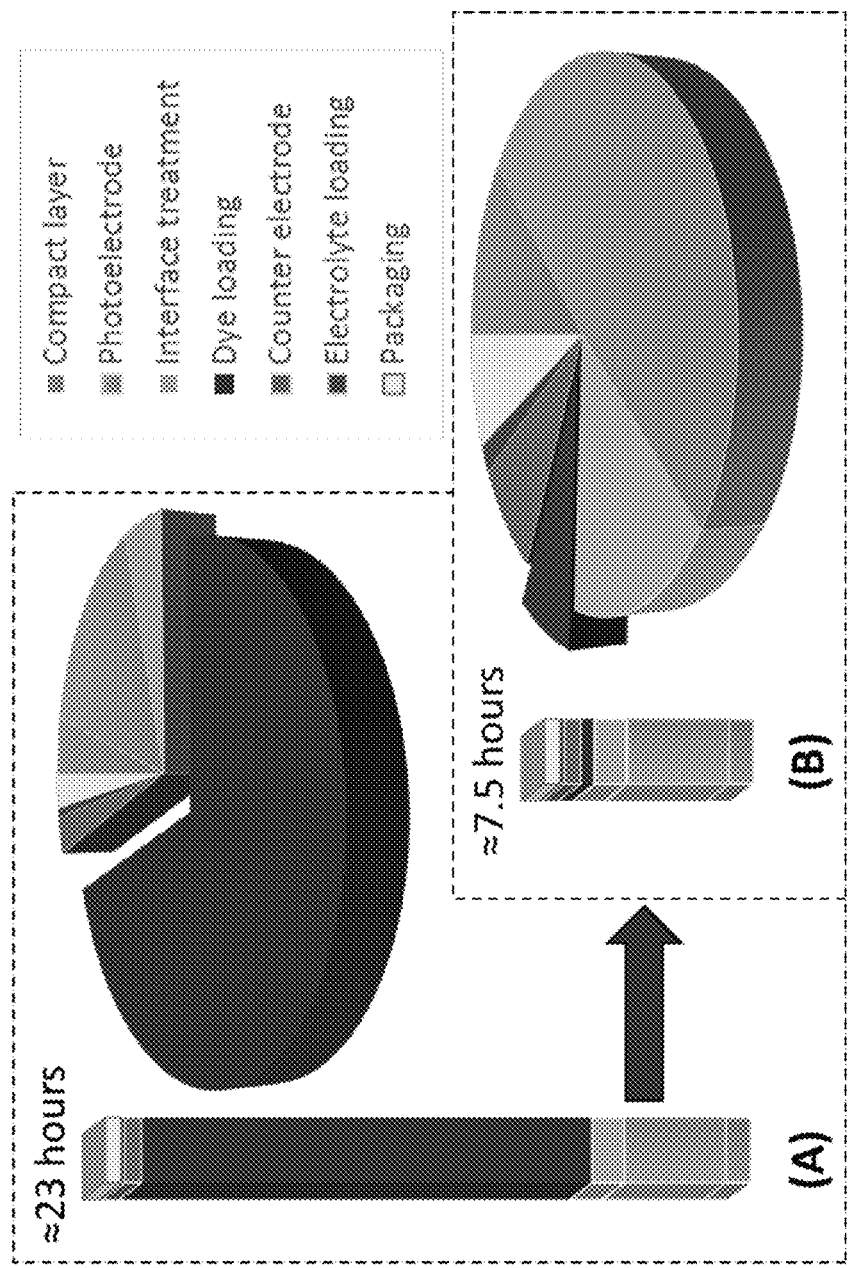
FIG. 16 is a graphical depiction of the contribution of each major process to the average duration of DSC fabrication using (A) dip-coating, and (B) FCD for dye sensitization according to certain aspects of the present invention.

The gas-phase self-assembled monolayer deposition technique of the present invention, which has been coined Functionalized Carboxylate Deposition (FCD), for the sensitization of inorganic substrate materials, such as nanoporous TiO$_2$ photoelectrodes for DSCs, has great advantages over the current state-of-the-art dip-coating process. FIG. 16 shows a visual depiction of the average time necessary for fabrication of DSCs with a breakdown of each individual process. FCD reduced the dye loading time by up to 98% compared to the current state-of-the-art dip-coating process, which produced a 67% reduction in the overall fabrication time. FCD also reduces dye sensitization from being the major contributor to fabrication time (70%), to being the second fastest process in DSC fabrication (only 7%).

Not only was the dying time tremendously reduced, DSCs fabricated using FCD produced ≥1.5 times the efficiency of dip-coating for the dyes tested with no change in dye-surface bonding. The FCD process of the present invention also tremendously reduced the time, waste, and organic solvent use associated with DSC dye sensitization.

Example 2

Comparison of Chromatographic Efficiency

Figure 8:
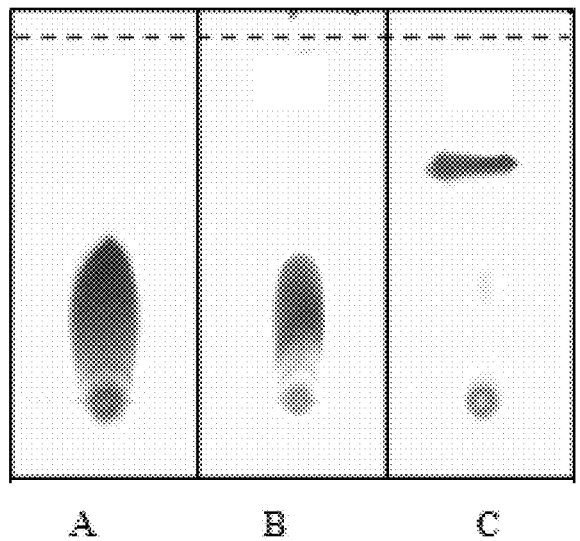
FIG. 8 shows the chromatographic efficiency of methyl violet developed in 7% methanol in chloroform on an untreated thin-layer chromatography slide (A), a thin-layer chromatography slide treated with cyanoacetic acid via a solution dipping process (B), and a thin-layer chromatography slide treated with cyanocetic acid via the molecular vapor deposition process according to certain aspects of the present invention, the dashed line representing the solvent front.

The behavior of methyl violet (MV) on untreated silicon-oxide thin-layer chromatography (TLC) slides were tested against TLC slides treated with cyanoacetic acid via a solution dipping process and the molecular vapor deposition process, designated FCD, as described in Example 1. MV was spotted onto the slides and the slides were developed in 7% methanol in chloroform. The slides were then removed from the mobile phase and visually analyzed for chromatographic efficiency as depicted in FIG. 8 wherein the dashed line represents the solvent front. The TLC slide treated by FCD, shown as C in FIG. 8, displayed a dramatically improved separation efficiency, 2100 theoretical plates, as compared to the untreated TLC plate, shown as A in FIG. 8, and the TLC plate treated by the solution dipping process, approximately 36 theoretical plates each, shown as B in FIG. 8.

The behavior of methyl violet (MV) on untreated silicon-dioxide was tested against silicon-dioxide treated with cyanoacetic acid via a solution deposition process and the molecular vapor deposition (FCD) process described herein. The untreated silicon-oxide (5 g) was washed with 10 mL methanol for 24 hours. The methanol was decanted, the silica washed three times with 10 mL methanol, 10 mL fresh methanol added, and the silica slurried and packed into a 6.6×150 mm glass LC column. Solution-phase modified silica was prepared by first washing 5 g silica in 10 mL methanol. The methanol was decanted and the silica dried. To the washed silica was added a 10 mL solution of 2.5 g cyano-acetic acid suspended in toluene. The silica-toluene slurry was shaken at room temperature for 24 hours, the toluene decanted, and the silica washed three times with 10 mL methanol. The washed silica (in methanol) was slurry-packed into a 6.6×150 mm column. The FCD-modified silica was prepared by placing 5 g of 40-60μ silica-oxide in the bottom of a modified Parr Oxygen bomb (outfitted with high-temperature o-rings, plugs for the electrode holders and one gas outlet, and a gas-tight ball valve and vacuum gauge placed inline between the other gas outlet and the vacuum pump) and 2.5 g of cyano-acetic acid in the reactant holder. The chamber was placed under a vacuum of approximately 40 mm Hg and heated to approximately 140° C. for a period of 1 hr. Over a period of approximately 30 min, the chamber was cooled to 100° C. after which over a further 30 min the chamber was cooled to room temperature. The silica was removed, washed three (3) times with methanol, and slurry-packed into a 6.6×150 mm liquid chromatography column.

The silica prepared via solution deposition was prepared by dissolving 2.5 g of cyanoacetic acid in 10 mL of ethanol then adding 5 g of 40-60μ silica to the solution. The mixture was then vortexed to suspend the silica and then shaken for 24 hrs at room temperature and pressure. The silica was then washed three (3) times with 10 mL methanol and packed into a 6.6×150 mm HPLC column.

Figure 9:
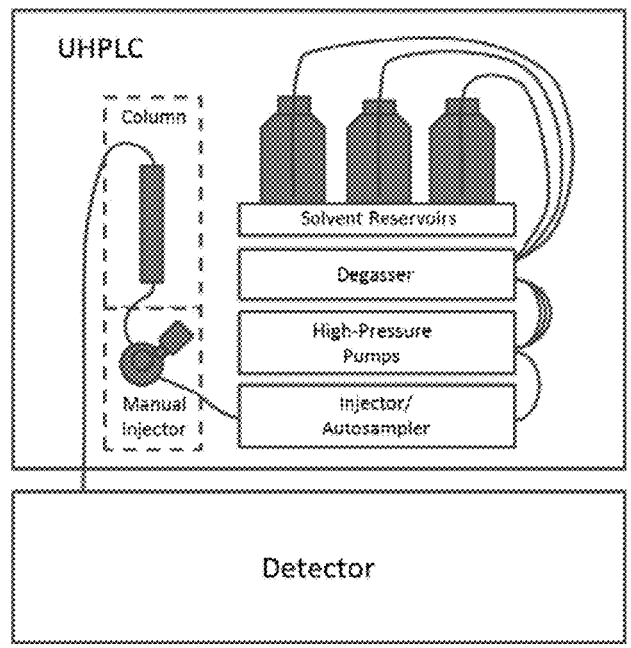
FIG. 9 is a diagram of an HPLC system that includes an HPLC column, the HPLC column having comparative results when packed with (i) untreated silicon-oxide, (ii) silicon-oxide treated by a solution-phase with a reactant, and (iii) silicon-oxide treated by a gas-phase with a reactant according to certain aspects of the present invention.
Figure 10:
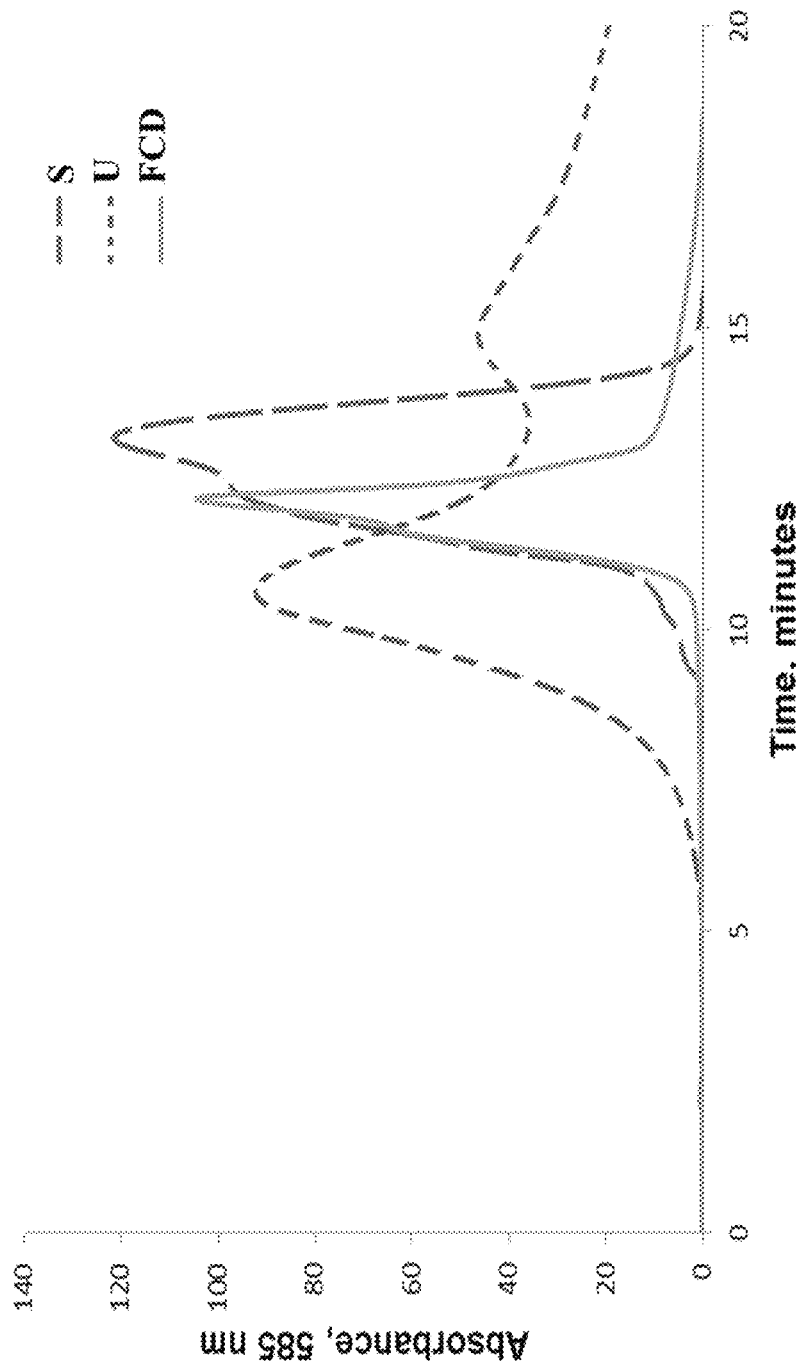
FIG. 10 is a graph illustrating the chromatograms of methyl violet on the three various HPLC columns that were run in the HPLC system as described in FIG. 9, with "U" referring to the untreated silicon-oxide, "S" referring to the silicon oxide treated by a solution-phase with cyano-acetic acid as the reactant, and "FCD" referring to the silicon-oxide treated by a gas-phase with cyano-acetic acid as the reactant according to certain aspects of the present invention.

The packed HPLC column was then added to an HPLC system as illustrated in FIG. 9 and 10μ of 0.1 mg/mL of MV was injected onto the column and eluted with a gradient elution from 90:10 CHCl$_3$:MeOH to 100% MeOH over a 20 min period with a flow rate of 1.5 mL/min and data was collected on a UV-Vis multi-wavelength detector with the results presented in FIG. 10.

As depicted in FIG. 10, the solution-phase deposition of cyanoacetic acid (S) resulted in sharper MV peak over that seen with the untreated silica (U). However, the column prepared by functionalized carboxylate deposition treated silica (FCD) resulted in an even narrower MV peak as compared to the silica prepared by solution deposition.

From the data presented here and illustrated in FIGS. 8 and 10, there is improved performance of the TLC plate and the HPLC column prepared via FCD over the solution phase processing, which is believed to be due to a greater concentration of cyanoacetic acid deposited onto the surface of the silica-oxide via FCD than the traditional solution-based.

It should be emphasized that the described embodiments of this disclosure are merely possible examples of implementations and are set forth for a clear understanding of the principles of this disclosure. Many variations and modifications may be made without departing substantially from the spirit and principles of this disclosure. All such modifications and variations are intended to be included herein within the scope of this disclosure and protected by the following claims.

We claim:

1. A method of forming a self-assembled monolayer hybrid material, the method comprising:
providing an inorganic oxide substrate in a reaction chamber, the inorganic oxide material having at least one surface;
providing a reactant in the reaction chamber, the reactant comprising at least one α-carbon modified carboxylic acid having an electron withdrawing functional group on the α-carbon to the carboxylate;
heating the inorganic oxide substrate and the reactant in the chamber to a temperature to allow evaporation or sublimation of the reactant into a gas-phase; and
depositing the reactant in the gas-phase onto at least a portion of the at least one surface of the inorganic oxide substrate for a period of time to form a self-assembled monolayer of the reactant covalently bound to the portion of the at least one surface of the inorganic oxide substrate.

2. The method of claim 1, wherein the reactant is provided as a liquid, solid, solution or suspension.

3. The method of claim 1, wherein the electron withdrawing functional group on the α-carbon to the carboxylate is a nitrile.

4. The method of claim 1, wherein the at least one α-carbon modified carboxylic acid comprises a structure of Formula 1A and/or Formula 1B:

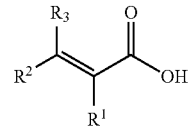

Formula 1A

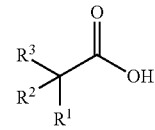

Formula 1B wherein $R^1$ in Formula 1A and Formula 1B is the electron withdrawing functional group on the α-carbon to the carboxylate, the electron withdrawing functional group chosen from a nitrile, nitro, halogen, hydroxyl, sulfonic acid, $NR_aR'_a$, $SR_b$, $COR_c$, and $COOR_d$;
wherein $R_a$ and $R'_a$ may be each chosen from the group consisting of H, O, $C_{1-20}$ hydroxyl, $C_{1-20}$ alkyl, CO—($C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, and $C_{1-20}$ heteroaryl;
wherein $R_b$ is chosen from the group consisting of H, Cd, Hg, As, Zn, Na$_2$, Pb, O$_3$—H, $C_{1-20}$ hydroxyl, $C_{1-20}$ alkyl, CO—($C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, and $C_{1-20}$ heteroaryl;
wherein $R_c$ is chosen from the group consisting of H, $C_{1-20}$ hydroxyl, $C_{1-20}$ alkyl, CO—($C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, and $C_{1-20}$ heteroaryl;
wherein $R_d$ is chosen from the group consisting of H, $C_{1-20}$ hydroxyl, $C_{1-20}$ alkyl, CO—($C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, and $C_{1-20}$ heteroaryl;

wherein $R_f$, $R_g$, and $R_h$ may be each independently a halo, $NR_aR'_a$, $SR_b$, $COR_c$, $COOR_d$, $CR_e$, $C_{0-20}$ hydroxyl, $C_{1-20}$ alkyl, $C_{1-20}$ haloalkyl, $C_{1-20}$ halocycloalkyl, $C_{1-20}$ haloheterocycl, CO—($C_{1-20}$ alkyl), $C_{1-20}$ alkyl, $C_{1-20}$ cycloalkyl, $C_{1-20}$ alkene, $C_{1-20}$ conjugated alkene, $C_{1-20}$ heterocycl, $C_{1-20}$ conjugated heterocycl, $C_{1-20}$ aryl, and $C_{1-20}$ heteroaryl; and wherein $R_e$ is chosen from the group consisting of $H_3$, $F_3$, $Cl_3$, N, $C_{0-20}$ hydroxyl, $C_{1-20}$ alkyl, CO—($C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, and $C_{1-20}$ heteroaryl.

5. The method of claim 1, wherein the period of time of depositing the reactant in the gas-phase onto the at least one surface of the inorganic oxide substrate to form the self-assembled monolayer of the reactant covalently bound to the at least one surface of the inorganic oxide substrate is between about 10 minutes and about 45 minutes.

6. The method of claim 1, wherein the period of time of depositing the reactant in the gas-phase onto the at least one surface of the inorganic oxide substrate to form the self-assembled monolayer of the reactant covalently bound to the at least one surface of the inorganic oxide substrate is between about 15 minutes and about 40 minutes.

7. The method of claim 1, wherein the temperature is held below a thermal degradation point of the reactant.

8. The method of claim 1, wherein the inorganic oxide substrate comprises a metal oxide chosen from silicon dioxide, zinc oxide, titanium dioxide, aluminum oxide, an iron oxide, tin oxide, indium oxide, indium doped tin oxide, copper oxide, tungsten oxide, silver oxide, palladium oxide, chromium oxide, manganese oxide, thallium oxide, vanadium oxide, antimony oxide, and combinations thereof.

9. The method of claim 1, wherein the metal oxide has a surface that is nanoporous.

10. A method of forming a self-assembled monolayer hybrid material, the method comprising:
providing an inorganic oxide substrate in a reaction chamber, the inorganic oxide material having at least one surface;
providing a reactant in a gas-phase in the reaction chamber, the reactant comprising at least one α-carbon modified carboxylic acid having an electron withdrawing functional group on the α-carbon to the carboxylate; and
depositing the reactant in the gas-phase onto at least a portion of the at least one surface of the inorganic oxide substrate for a period of time to form a monolayer of the reactant covalently bound to the portion of the at least one surface of the inorganic oxide substrate.

11. The method of claim 10, wherein the electron withdrawing functional group on the α-carbon to the carboxylate is a nitrile.

12. The method of claim 10, wherein the at least one α-carbon modified carboxylic acid comprises a structure of Formula 1A and/or Formula 1B:

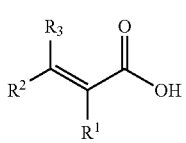

Formula 1A

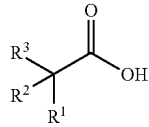

Formula 1B wherein $R^1$ in Formula 1A and Formula 1B is the electron withdrawing functional group on the α-carbon to the carboxylate, the electron withdrawing functional group chosen from a nitrile, nitro, halogen, hydroxyl, sulfonic acid, $NR_aR'_a$, $SR_b$, $COR_c$, and $COOR_d$;

wherein $R_a$ and $R'_a$ may be each chosen from the group consisting of H, O, $C_{1-20}$ hydroxyl, $C_{1-20}$ alkyl, CO—($C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, and $C_{1-20}$ heteroaryl;

wherein $R_b$ is chosen from the group consisting of H, Cd, Hg, As, Zn, $Na_2$, Pb, $O_3$—H, $C_{1-20}$ hydroxyl, $C_{1-20}$ alkyl, CO—($C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, and $C_{1-20}$ heteroaryl;

wherein $R_c$ is chosen from the group consisting of H, $C_{1-20}$ hydroxyl, $C_{1-20}$ alkyl, CO—($C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, and $C_{1-20}$ heteroaryl;

wherein $R_d$ is chosen from the group consisting of H, $C_{1-20}$ hydroxyl, $C_{1-20}$ alkyl, CO—($C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, and $C_{1-20}$ heteroaryl;

wherein $R_f$, $R_g$, and $R_h$ may be each independently a halo, $NR_aR'_a$, $SR_b$, $COR_c$, $COOR_d$, $CR_e$, $C_{0-20}$ hydroxyl, $C_{1-20}$ alkyl, $C_{1-20}$ haloalkyl, $C_{1-20}$ halocycloalkyl, $C_{1-20}$ haloheterocycl, CO—($C_{1-20}$ alkyl), $C_{1-20}$ alkyl, $C_{1-20}$ cycloalkyl, $C_{1-20}$ alkene, $C_{1-20}$ conjugated alkene, $C_{1-20}$ heterocycl, $C_{1-20}$ conjugated heterocycl, $C_{1-20}$ aryl, and $C_{1-20}$ heteroaryl; and wherein $R_e$ is chosen from the group consisting of $H_3$, $F_3$, $Cl_3$, N, $C_{0-20}$ hydroxyl, $C_{1-20}$ alkyl, CO—($C_{1-20}$ alkyl), $C_{1-20}$ alkane, $C_{1-20}$ alkene, $C_{1-20}$ conjugated alkene, $C_{1-20}$ heterocycl, $C_{1-20}$ conjugated heterocycl, an asymmetric carbon atom of $CR_fR_gR_h$, $C_{1-20}$ aryl, and $C_{1-20}$ heteroaryl.

13. The method of claim 10, wherein the period of time of depositing the reactant in the gas-phase onto the at least one surface of the inorganic oxide substrate to form the self-assembled monolayer of the reactant covalently bound to the at least one surface of the inorganic oxide substrate is between about 10 minutes and about 45 minutes.

14. The method of claim 10, wherein the temperature is held below a thermal degradation point of the reactant.

15. The method of claim 10, wherein the reactant deposited onto the at least one surface of the inorganic oxide surface has bi-dentate bonding.

16. A method of sensitizing a photoelectrode of a dye-sensitized solar cell, the method comprising:
providing the photoelectrode in a reaction chamber, the photoelectrode having at least one surface;

providing a reactant in a gas-phase in the reaction chamber, the reactant comprising at least one α-carbon modified carboxylic acid having an electron withdrawing functional group on the α-carbon to the carboxylate; and depositing the reactant in the gas-phase onto the at least one surface of the photoelectrode for a period of time to form a self-assembled monolayer of the reactant covalently bound to at least a portion of the at least one surface of the photoelectrode;

wherein the period of time of depositing the reactant in the gas-phase onto the at least one surface of the photoelectrode is between about 10 minutes and about 45 minutes.

17. The method of claim 16, wherein the dye-sensitized solar cell has an efficiency greater than about 1.5 times compared to an efficiency of a dye-sensitized solar cell fabricated with a photoelectrode sensitized with a solution of the reactant in a dip-coating process.

18. The method of claim 16, wherein the photoelectrode is an inorganic oxide substrate chosen from silicon dioxide, zinc oxide, titanium dioxide, aluminum oxide, an iron oxide, tin oxide, indium oxide, indium doped tin oxide, copper oxide, tungsten oxide, silver oxide, palladium oxide, chromium oxide, manganese oxide, thallium oxide, vanadium oxide, antimony oxide, and combinations thereof.

19. The method of claim 16, wherein the inorganic oxide substrate is nanoporous titanium dioxide and the electron withdrawing functional group on the α-carbon to the carboxylate of the reactant is a nitrile.

* * * * *